US006967348B2

(12) United States Patent
Cowles et al.

(10) Patent No.: US 6,967,348 B2
(45) Date of Patent: Nov. 22, 2005

(54) SIGNAL SHARING CIRCUIT WITH MICROELECTRIC DIE ISOLATION FEATURES

(75) Inventors: Timothy B. Cowles, Boise, ID (US); Aron T. Lunde, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/176,330

(22) Filed: Jun. 20, 2002

(65) Prior Publication Data

US 2003/0235929 A1 Dec. 25, 2003

(51) Int. Cl.[7] .................. H01L 23/58; H01L 21/66; G06F 17/50
(52) U.S. Cl. .................. 257/48; 257/68; 257/71; 257/238; 257/905; 257/906; 257/908; 438/17; 438/239; 438/244; 438/250; 438/253; 716/18
(58) Field of Search .................. 438/460, 462, 438/14, 112, 123, 111, 124, 107, 108, 109, 438/113, 130, 17, 250, 239–244, 253; 257/48, 257/68, 71, 905–908, 238; 716/11–18

(56) References Cited

U.S. PATENT DOCUMENTS

| | | | |
|---|---|---|---|
| 3,721,838 A | 3/1973 | Brickman et al. .......... 307/303 |
| 4,379,259 A | 4/1983 | Varadi et al. .................. 324/73 |
| 4,689,494 A | 8/1987 | Chen ....................... 307/202.1 |
| 4,791,319 A | 12/1988 | Tagami et al. .............. 307/441 |
| 4,847,810 A | 7/1989 | Tagami ....................... 365/200 |
| 5,059,835 A | 10/1991 | Lauffer et al. .............. 307/576 |
| 5,059,899 A | 10/1991 | Farnworth et al. ......... 324/13.1 |
| 5,099,149 A | 3/1992 | Smith ........................ 307/465 |
| 5,301,143 A | 4/1994 | Ohri et al. ..................... 365/96 |
| 5,301,159 A | 4/1994 | Lee .......................... 365/225.7 |
| 5,424,672 A | 6/1995 | Cowles et al. .............. 327/525 |
| 5,442,282 A | 8/1995 | Rostoker .................. 324/158.1 |
| 5,446,695 A | 8/1995 | Douse et al. ............... 365/222 |
| 5,457,659 A | 10/1995 | Schaefer ...................... 365/222 |
| 5,469,393 A | 11/1995 | Thomann .................... 365/201 |
| 5,485,031 A | 1/1996 | Zhang et al. ............... 257/530 |
| 5,485,032 A | 1/1996 | Schepis et al. ............. 257/530 |
| 5,486,707 A | 1/1996 | Look et al. .................... 257/52 |
| 5,486,776 A | 1/1996 | Chiang ........................ 326/41 |
| 5,490,042 A | 2/1996 | Perkins ....................... 361/778 |
| 5,495,181 A | 2/1996 | Kolze ........................... 326/38 |
| 5,495,436 A | 2/1996 | Callahan ...................... 365/96 |
| 5,498,895 A | 3/1996 | Chen .......................... 257/355 |
| 5,500,588 A | 3/1996 | Worley .................... 324/158.1 |
| 5,502,000 A | 3/1996 | Look et al. .................... 437/60 |
| 5,502,333 A | 3/1996 | Bertin et al. ................ 257/685 |
| 5,502,668 A | 3/1996 | Shimoji et al. ......... 365/185.28 |
| 5,502,674 A | 3/1996 | Griffus et al. .............. 365/200 |
| 5,506,518 A | 4/1996 | Chiang ........................ 326/41 |
| 5,508,638 A | 4/1996 | Cowles et al. ................ 326/38 |
| 5,537,108 A | 7/1996 | Nathan et al. ......... 340/825.84 |
| 5,539,325 A | 7/1996 | Rostoker et al. ............ 324/763 |
| 5,548,560 A | 8/1996 | Stephens, Jr. et al. ... 365/233.5 |
| 5,594,694 A | 1/1997 | Roohparvar et al. ........ 365/201 |

(Continued)

Primary Examiner—B. William Baumeister
Assistant Examiner—Igwe U. Anya
(74) Attorney, Agent, or Firm—Schwegman, Lundberg, Woessner & Kluth, P.A.

(57) ABSTRACT

A signal sharing circuit includes a first pad adapted to receive a signal and a first sharing device associated with a first microelectronic die. The first sharing device is adapted to selectively share the signal with at least a second microelectronic die on one side of the first microelectronic die in response to a first share control signal.

70 Claims, 10 Drawing Sheets

U.S. PATENT DOCUMENTS

| | | | |
|---|---|---|---|
| 5,648,661 A | 7/1997 | Rostoker et al. | 257/48 |
| 5,648,730 A * | 7/1997 | Bhuva et al. | 324/763 |
| 5,661,690 A | 8/1997 | Roohparvar | 365/201 |
| 5,679,609 A | 10/1997 | Aimi et al. | 437/205 |
| 5,706,235 A | 1/1998 | Roohparvar et al. | 365/201 |
| 5,726,482 A | 3/1998 | Nathan et al. | 257/529 |
| 5,734,661 A | 3/1998 | Roberts et al. | 371/22.5 |
| 5,754,486 A | 5/1998 | Nevill et al. | 365/201 |
| 5,757,705 A | 5/1998 | Manning | 365/201 |
| 5,809,038 A | 9/1998 | Martin | 371/21.2 |
| 5,838,163 A | 11/1998 | Rostoker et al. | 324/763 |
| 5,848,018 A | 12/1998 | McClure | 365/201 |
| 5,896,400 A | 4/1999 | Roohparvar et al. | 371/22.1 |
| 5,966,021 A | 10/1999 | Eliashberg et al. | 324/760 |
| 5,994,915 A | 11/1999 | Farnworth et al. | 324/765 |
| 5,995,426 A | 11/1999 | Cowles et al. | 365/201 |
| 5,996,096 A | 11/1999 | Dell et al. | 714/710 |
| 6,025,730 A | 2/2000 | Akram et al. | 324/758 |
| 6,052,321 A | 4/2000 | Roohparvar | 365/201 |
| 6,094,377 A | 7/2000 | Roohparvar et al. | 365/189.05 |
| 6,094,388 A | 7/2000 | Cowles | 365/201 |
| 6,104,651 A | 8/2000 | Cowles et al. | 365/201 |
| 6,114,878 A | 9/2000 | Loughmiller et al. | 326/101 |
| 6,130,811 A | 10/2000 | Gans et al. | 361/56 |
| 6,204,678 B1 | 3/2001 | Akram et al. | 324/758 |
| 6,228,684 B1 | 5/2001 | Maruyama | 438/113 |
| 6,246,250 B1 | 6/2001 | Doherty et al. | 324/765 |
| 6,275,058 B1 | 8/2001 | Lunde | 324/765 |
| 6,300,786 B1 | 10/2001 | Doherty et al. | 324/765 |
| 6,313,658 B1 | 11/2001 | Farnworth et al. | 324/765 |
| 6,337,577 B1 | 1/2002 | Doherty et al. | 324/765 |
| 6,362,087 B1 | 3/2002 | Wang et al. | 438/597 |
| 6,366,112 B1 | 4/2002 | Doherty et al. | 324/765 |
| 6,366,766 B1 | 4/2002 | Dalebroux | 455/217 |
| 6,396,300 B1 | 5/2002 | Loughmiller et al. | 326/16 |
| 6,417,695 B1 | 7/2002 | Duesman | 326/47 |
| 6,433,574 B1 | 8/2002 | Doherty et al. | 324/765 |
| 6,462,575 B1 * | 10/2002 | Cram | 324/765 |
| 6,466,047 B1 | 10/2002 | Doherty et al. | 324/765 |
| 6,472,239 B2 | 10/2002 | Hembree et al. | 438/18 |
| 6,484,279 B2 | 11/2002 | Akram | 714/724 |
| 6,522,161 B2 | 2/2003 | Lunde | 324/765 |
| 6,525,982 B1 | 2/2003 | Cowles | 365/225.7 |
| 6,545,510 B1 | 4/2003 | Cowles | 327/74 |
| 6,590,225 B2 * | 7/2003 | Whetsel et al. | 257/48 |
| 6,630,685 B1 | 10/2003 | Lunde | 257/691 |
| 2001/0027549 A1 | 10/2001 | Cowles | 714/734 |
| 2002/0130687 A1 | 9/2002 | Duesman | 326/101 |
| 2002/0133767 A1 | 9/2002 | Cowles | 714/719 |
| 2002/0133769 A1 | 9/2002 | Cowles et al. | 714/719 |
| 2002/0133770 A1 | 9/2002 | Cowles | 714/723 |
| 2003/0063056 A1 * | 4/2003 | Frazee et al. | 345/87 |
| 2003/0086318 A1 | 5/2003 | Cowles | 365/200 |
| 2003/0124816 A1 * | 7/2003 | Potts | 438/462 |
| 2003/0137030 A1 | 7/2003 | Lunde | 257/620 |

* cited by examiner

SIGNAL SHARING CIRCUIT WITH MICROELECTRIC DIE ISOLATION FEATURES

CROSS-REFERENCE TO RELATED APPLICATIONS

The present application is related to a patent application entitled "Isolation Circuit," U.S. application Ser. No. 10/176,015, filed Jun. 20, 2002, and is assigned to the same assignee as the present application and is incorporated herein in its entirety by reference.

FIELD OF THE INVENTION

The present invention relates generally to microelectronic dies, semiconductor chips and the like, and more particularly to a signal sharing circuit to share a signal across multiple dies on a semiconductor wafer with die isolation features for wafer level testing of the dies or for other purposes.

BACKGROUND OF THE INVENTION

In semiconductor wafers including microelectronic dies formed on the wafers and the like, an electrical signal can be transmitted or shared from one component part or die to another. This can be the case in testing a wafer when a test signal can be sent to multiple different dies. One problem with sharing an electrical signal from one part or die to another is that a malfunction or defect in any of the dies can adversely effect the electrical signal being shared and cause the remaining dies to malfunction or appear to fail the test when the dies may actually be good.

One example where electrical signals are shared by a plurality of different parts or dies is in a parallel test system for Wafer Level Testing (WLT). In WLT, multiple dies on a wafer can be evaluated simultaneously. Prior to WLT, each of the dies on a wafer can be individually tested by probe testing or by a similar procedure to determine if any of the dies have certain defects. After probe testing, several predetermined electrical signals can be applied to contact pads formed on the wafer to more efficiently test multiple dies simultaneously. If one or more of the dies in a group being tested together are defective, the integrity of the shared electrical signal can be impacted such that potentially all of the dies sharing the signal can fail the test. There can also be uses other than testing when electrical signals are shared and one or more defective parts or dies can adversely effect the electrical signals and consequently the performance of a device or system incorporating the dies.

Electrical signals such as the shared electrical signals can be applied to a die by a conductive pad formed on the die or wafer. For example, multiple test pads can be formed at various locations on a semiconductor wafer to simultaneously apply multiple test signals across multiple microelectronic dies during WLT. The test pads can be connected by conductive lines or traces to signal or part pads that are coupled to each microelectronic die. Accordingly, prior to the present invention, multiple probe or touch down locations can be required to completely test all dies on a semiconductor wafer. Additionally, there is no flexibility as to which test pads the test signals can be applied to test certain dies or groups of dies. Because of a bad die or other problems, it may be desirable to apply a test signal to a particular die or group of dies by a probe touch down to a different test pad than the one that would normally receive the test signal to test the particular die or group of dies.

During normal operation of the die, a test pad and associated interconnect lines or traces can become inadvertently coupled to an associated die, or remnants of a test pad and associated interconnect lines remaining after the dies are separated from the wafer can become inadvertently coupled to the die. The test pad and interconnecting lines can present a substantial capacitive and resistive load coupled to the die that can adversely effect performance of the die during normal operation. Even a remaining metal trace hanging free after separation of the dies can have a detrimental effect.

Accordingly, for the reasons stated above, and for other reasons that will become apparent upon reading and understanding the present specification, there is a need for a signal sharing circuit that is programmable to selectively share a test signal, power, ground or other signals in different directions across multiple dies or between selected dies. Additionally, there is a need for a signal sharing circuit that permits fewer probe touch downs. Additionally, there is a need for a circuit or device to isolate a defective die to prevent a shared signal from being impacted by the defective die and thereby adversely effecting the operation or testing of other dies to which the shared signal is applied. Additionally, there is a need for a circuit or device to prevent a test pad, other type pad or associated metallization or conductive material from being coupled to an associated microelectronic die during normal operation of the die or during operation of the die other than when the pad is needed to apply a test signal or another signal. Further, there is a need for a method of testing multiple dies on a wafer where the test signal can be selectively shared in different directions across multiple dies or between selected dies and a method that requires fewer probe touch downs or tester contact locations.

SUMMARY OF THE INVENTION

The above mentioned feature of programmably sharing a test signal, power, ground or other signal in different directions across multiple dies or between selected dies of a semiconductor wafer and the problems with defective microelectronic dies are addressed by the present invention and will be understood by reading and studying the following specification. Signal sharing circuits, isolation circuits, microelectronic dies, semiconductor wafers and systems are provided by the present invention that programmably or selectively share a signal across multiple dies or selected dies to test or evaluate multiple dies simultaneously with a minimum number of contacts or touches by a testing device. Additionally, the circuits, dies, wafers and systems provided by the present invention prevent a shared signal from being impacted by any defective dies to prevent the defective dies from effecting the operation or testing of other dies to which the shared signal can be applied. The present invention also provides a circuit or device to prevent a test pad or other pad from being coupled to an associated microelectronic die during normal operation of the die or during operation of the die other than when the pad is needed to apply a signal.

In accordance with an embodiment of the present invention, a signal sharing circuit includes a first pad adapted to receive a signal and a first sharing device associated with a first microelectronic die and adapted to selectively share the signal with at least a second microelectronic die on one side of the first microelectronic die in response to a first share control signal.

In accordance with another embodiment of the present invention, a signal sharing circuit includes a first pad adapted to receive a signal and a part pad coupled to a first microelectronic die. An isolation circuit can be provided to transfer the signal from the first pad to the part pad in response to an isolation control signal. A first sharing device can be provided to couple the signal to a second microelectronic die on one side of the first microelectronic die in response to a first share control signal and a second sharing device can be provided to couple the signal to a third microelectronic die on another side of the first microelectronic die in response to a second share control signal.

In accordance with another embodiment of the present invention, an electronic device or module includes a plurality of microelectronic dies and at least one signal sharing device associated with each microelectronic die to selectively share a signal with an adjacent one of the plurality of microelectronic dies.

In accordance with another embodiment of the present invention, an electronic system includes a processor and a memory system coupled to the processor. At least one of the processor and the memory system are formed on a microelectronic die. The microelectronic die includes at least one sharing device to share a signal in one direction from the microelectronic die.

In accordance with another embodiment of the present invention, a method includes: applying a test signal, power or ground to a test pad; and selectively sharing the test signal, power or ground in at least one direction with a plurality of microelectronic dies.

These and other embodiments, aspects, advantages and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

In the drawings, like numerals describe substantially similar components throughout the several views. Like numerals having different letter suffixes or primed (X') represent different occurrences of substantially similar components.

DESCRIPTION OF THE EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments can be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process operations may have been utilized to form regions/junctions in the base semiconductor structure. The following detailed description is, therefore, not to be taken in a limiting sense, and the scope of the present invention is defined only by the appended claims.

The transistors described herein include transistors from bipolar-junction technology (BJT), field effect technology (FET), or complimentary metal-oxide-semiconductor (CMOS) technology. A metal-oxide-semiconductor (MOS) transistor includes a gate, a first node (drain) and a second node (source). Since a MOS transistor is typically a symmetrical device, the true designation of "source" and "drain" is only possible once voltage is impressed on the terminals. The designations of source and drain herein should be interpreted, therefore, in the broadest sense. It should also be noted that a P-channel MOS transistor could alternatively be used for an N-channel MOS transistor and vice versa with the polarity of the associated gate voltages merely being reversed. For example, applying a negative gate voltage in the situation of a P-channel MOS transistor to activate the transistor and reversing the polarity to apply a positive gate voltage to activate an N-channel transistor if an N-channel MOS transistor is substituted for a P-channel transistor.

Figure 1:
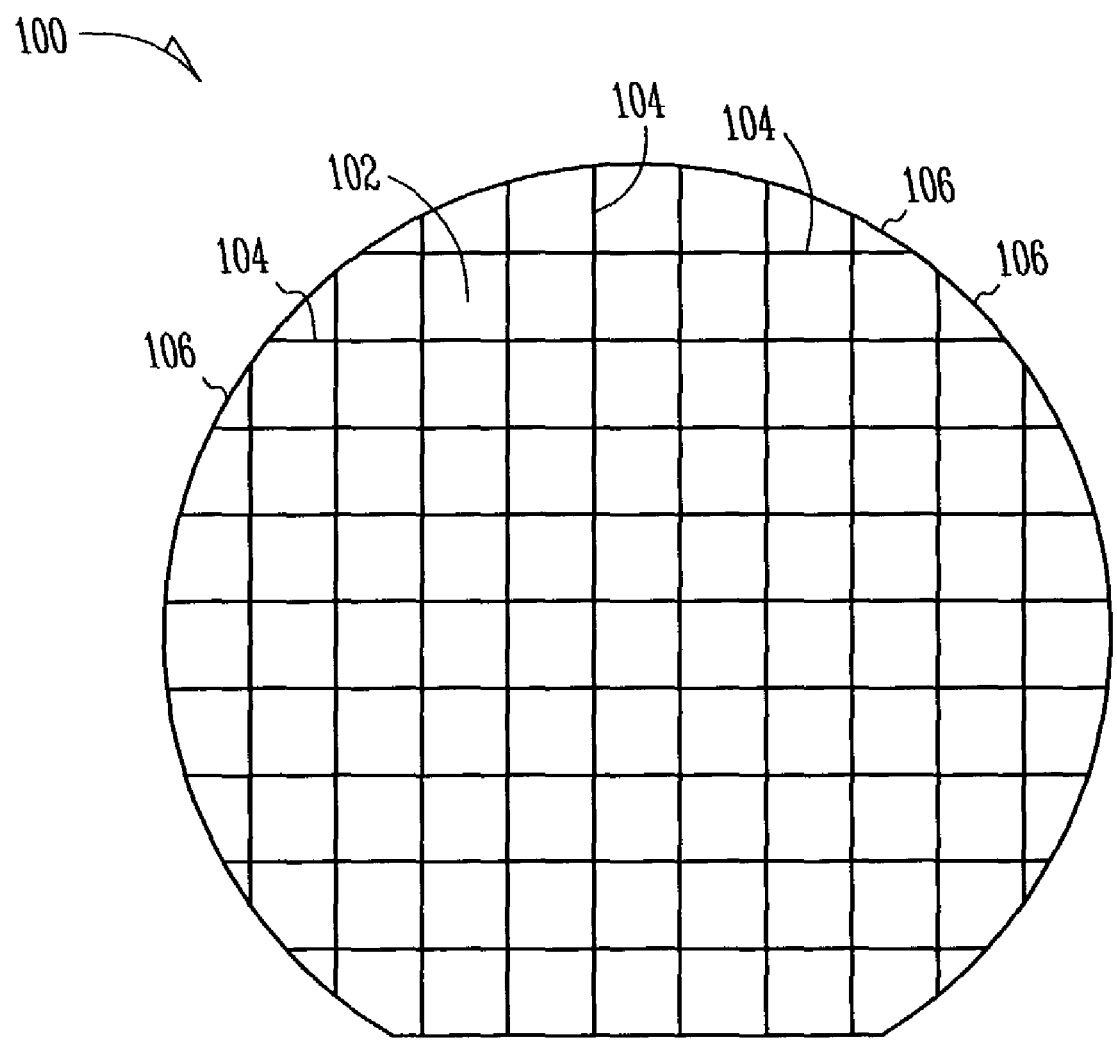
FIG. 1 is a top view of a wafer or substrate containing microelectronic or semiconductor dies in accordance with an embodiment of the present invention.

FIG. 1 is a top view of a wafer 100 or substrate containing a plurality of microelectronic or semiconductor dies 102 in accordance with an embodiment of the present invention. A die 102 is an individual pattern, typically rectangular, on a substrate that contains circuitry to perform a specific function. A semiconductor wafer 100 will typically contain a repeated pattern of such dies 102 containing the same functionality. Die 102 can further contain additional circuitry to extend to such complex devices as a monolithic processor with multiple functionality. Die 102 is typically packaged in a protective casing (not shown) with leads extending therefrom (not shown) providing access to the circuitry of the die 102 for unilateral or bilateral communication and control. The dies 102 are separated from one another by a scribe line 104. The scribe lines 104 can be used to separate each of dies 102 by sawing along the scribe lines 104. Near the edge of the wafer 100 are partial or incomplete dies that can be referred to as mutant dies 106. The mutant dies 106 have typically have insufficient area to contain the repeated circuitry formed on the complete dies 102.

Figure 2:
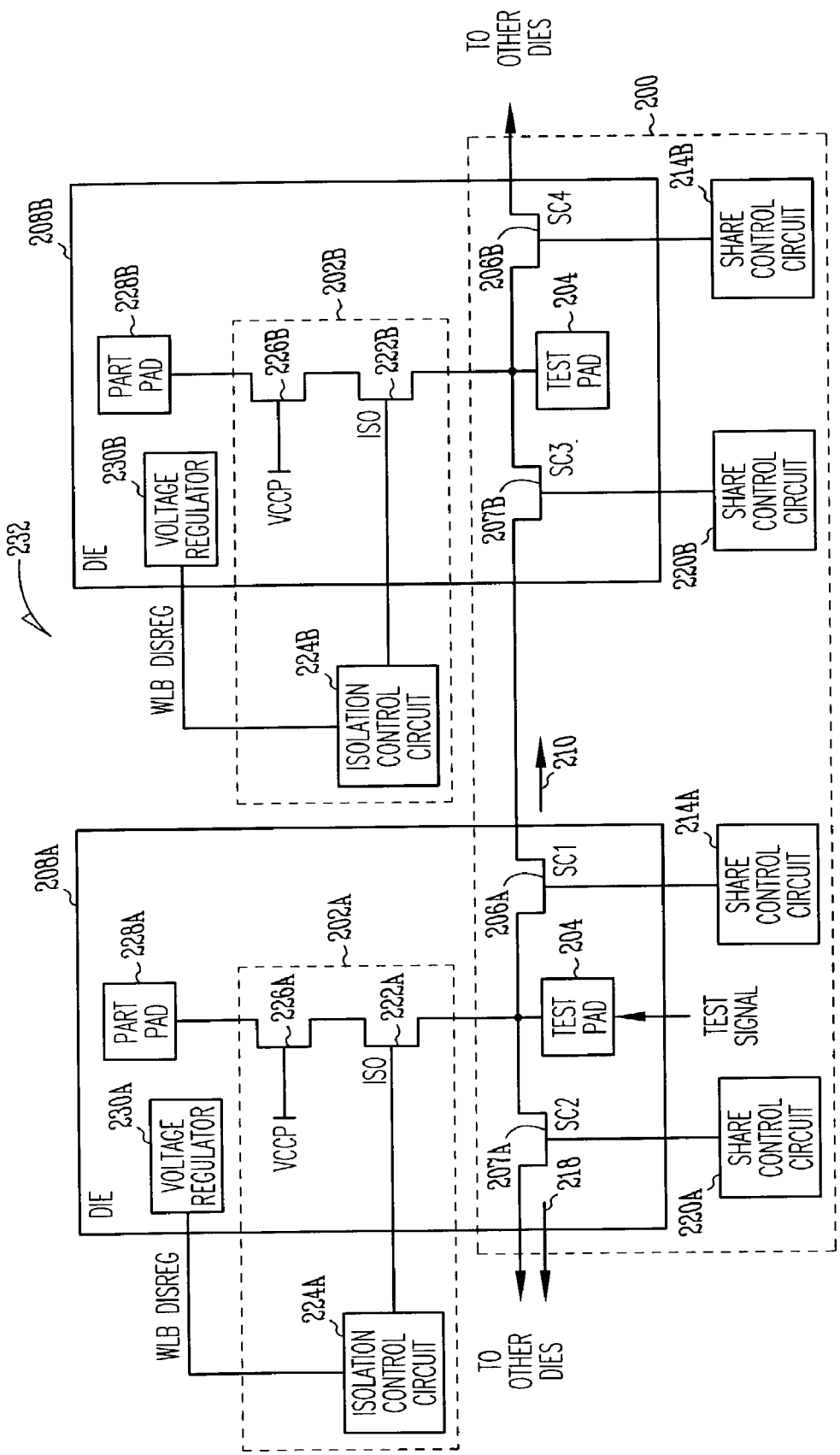
FIG. 2 is a block diagram of an signal sharing circuit and an isolation circuit in accordance with an embodiment of the present invention.

FIG. 2 is a block diagram of a signal sharing circuit 200 and isolation circuits 202 A and B in accordance with an embodiment of the present invention. The signal sharing circuit 200 can include a first pad or test pad 204A adapted to receive a signal, such as a test signal or a signal for another purpose. The test pad 204A can be coupled to a first sharing device 206A. The first sharing device 206A can be a MOS device, such as an N-channel transistor, P-channel transistor or a similar electronic switching device. The first sharing device 206A can be associated with a first microelectronic die 208A. The first sharing device 206A can be programmed to selectively share the test signal or other signal in one direction indicated by an arrow 210 from the first die 208A with at least a second microelectronic die 208B on one side of the first microelectronic die 208A. In the example in FIG. 2, the first sharing device 206A is an N-channel transistor and can share the test signal with one or a plurality of other microelectronic dies, such as die 208B to the right of the sharing device 206A in response to receiving a first share control signal (SC1) from a first share control circuit 214A that is coupled to the gate of the first sharing device 206A. Accordingly, the sharing circuit 200 can be programmed or operated by different share control signals (SC1–SC4 and so forth) to share the test signal applied to test pad 204A with other microelectronic dies, e.g., 208B. Therefore, the test signal, power, ground or other signal does not need to be applied to each microelectronic die 208 or to each test pad 204 associated with a respective microelectronic die 208, and tester resources can be saved and fewer probe contacts or probe touch downs are needed to test more dies simultaneously.

The sharing circuit 200 can also include a second sharing device 207A that can be associated with the first die 208A to share the test signal with other dies 208 (not shown in FIG. 2) in another direction from the first die 208A indicated by an arrow 218 in response to a second share control signal (SC2) from a second share control circuit 220A. In the example shown in FIG. 2, the second sharing device 207A can be a MOS device, such as an N-channel transistor or the like, that can be turned on or activated by a second share (SC2) control signal applied to the gate of the second sharing device 207A by the second share control circuit 220A.

In the example shown in FIG. 2, the signal sharing circuit 200 can include a third sharing device 207B associated with the second microelectronic die 208B. The third sharing device 207B can be an N-channel transistor and can be turned on or activated by a third share control signal (SC3) applied to the third sharing device 207B by a third share control circuit 220B to couple the test signal to the second die 208B. The signal sharing circuit 200 can include a fourth sharing device 206B to share the test signal with other dies 208 to the right of the second die 208B. The fourth sharing device 206B can be activated by a fourth share control signal (SC4) applied to the gate of the fourth sharing device 206B by a fourth share control circuit 214B. The sharing circuit 200 can continue in a similar form or structure in both directions from the sharing devices 207A and 206B with a pair of sharing devices (not shown in FIG. 2) similar to devices 206A and 207A or 206B and 207B being associated with each die 208.

While the third and fourth sharing devices 207B and 206B are selectively activated or programmed by applying the share control signals SC3 and SC4 respectively to share the test signal with other microelectronic dies 208 (not shown in FIG. 2) to the right of the second die 208B, the third and fourth sharing devices 207B and 206B may equally be selectively activated to share a test signal or other signal coming from the right of the fourth sharing device 206B with the first die 208A and with other dies to the left of the first die 208A by selectively activating the first and second sharing devices 206A and 207A. In this example, the test signal would not be applied to the test pad 204A but rather to some other test pad (not shown in FIG. 2) to the right of the fourth sharing device 206B. Accordingly, the sharing circuit 200 is flexible and can be programmed or operated by different share control signals (SC1–SC4 or the like) to share signals, power or ground in different directions across multiple dies 208 on a wafer 100 (FIG. 1).

The present invention permits a test signal, other types of signals, power or ground to be applied to a single, such as test pad 204A, or to a minimum number of test pads 204 rather than requiring that the test signal, other Type signal, power or ground be applied to each die 208 or test pad 204 associated with each die 208. The test signal, other type signal, power or ground can then be shared by the sharing circuit 200 with one or multiple other dies 208 in either or both directions from the die 208 associated with the test pad 204 at which the test signal, other signals, power or ground is applied by the tester or testing device (not shown in the drawings). The tester resources can therefore be saved or reduced by the signal sharing circuit 200 of the present invention and the tester can be adapted to test more dies simultaneously.

An isolation circuit, such as isolation circuit 202A, can also be associated with each die 208. The isolation circuit 202A can include a first isolation device 222A coupled to the test pad 204 and to a source/drain terminal of each of the first and second sharing devices 206A and 206B. The first isolation device 222A can be a MOS device, such an N-channel transistor, P-channel transistor or the like. The first isolation device 222A can be turned on or activated to couple the test signal to the die 208A by an isolation control signal (ISO) from an isolation control circuit 224A. The isolation circuit 202A can include a second isolation device 226A that can be coupled to a part pad 228A that is connected to the microelectronic die 208A. The second isolation device 226A can be a MOS device. If the second isolation device 226A is an N-channel transistor as shown in the example of FIG. 2, a gate of the second isolation device 226A can be connected to a high voltage signal VCCP whenever the die 208A is active for testing to couple the test signal from the first isolation device 222A to the part pad 228A. The second isolation device 226A is optional and may not be used in all implementations. The second isolation device 226A can be any device to selectively pass a signal or not pass a signal, such as a fuse type device, anti-fuse type device, conductive jumper, ball-bond, multiplexor or the like.

If the die 208A is bad, then the first and second isolation devices 222A and 226A can be turned off or inactivated to prevent the test signal from being applied to the bad die 208A. By isolating the bad die 208A, the test signal cannot be adversely impacted or corrupted and thereby effect the testing of the other dies 208 with which the test signal can be shared by programming the sharing circuit 200.

The isolation control circuit 224A can also provide a wafer level burn-in voltage regulator disconnect (WLBDisReg) signal to disconnect or inactivate a voltage regulator circuit 230A in the die 208A and to prevent power from being applied to any of the circuits or components formed on the die 208A. The WLBDisReg signal can be applied to the die 208A to prevent any power to parts of the die 208A when the die 208A is isolated because the die is bad or for other reasons.

While not shown in FIG. 2, all or portions of the sharing circuit 200 and the isolation circuit 202 can be formed on the die 208, in a scribe area 232 similar to scribe area 104 in FIG. 1, on a mutant die similar to mutant die 106 in FIG. 1 or on a sacrifice die which is a complete die area that is not used to form a regular die.

Figure 3:
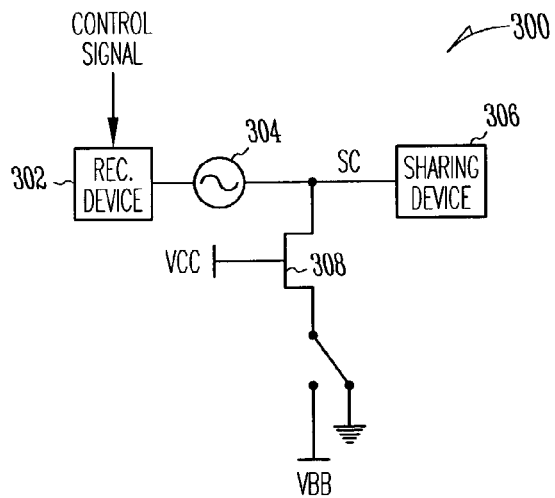
FIG. 3 is a block diagram of a share control circuit in accordance with another embodiment of the present invention.

FIG. 3 is a block diagram of a share control circuit 300 similar to the share control circuits 214 and 220 in FIG. 2 in accordance with an embodiment of the present invention. The share control circuit 300 can include a receiving device 302 adapted to receive a control signal from a testing device or apparatus (not shown in the Figures). The receiving device 302 can be a probe pad, a radio frequency identification circuit (RFID), such as a Bluetooth type device or the like, fuse control device or a similar device adapted to receive a control signal or pass a control signal. The receiving device 302 can be coupled to a programmable device 304, such as a fuse type device or the like. The programmable device 304 can be connected to a sharing device 306 similar to the sharing devices 206 of FIG. 2. The programmable device 304 or fuse type device can be programmed by blowing the fuse to prevent the sharing device 306 from receiving the control signal (SC1–SC4, etc.) and becoming active to share a test signal or other signal in one direction or the other direction as described with reference to FIG. 2. The programmable device 304 and the sharing device 306 can also be connected to a MOS device 308. In the example shown in FIG. 3, if the sharing device 306 is an N-channel MOS device, the MOS device 308 is also an N-channel transistor to connect a gate of the sharing device 306 to ground potential or to a potential VBB less than ground to prevent the sharing device 306 from operating or turning on during a predetermined operation of an associated die, similar to die 208 (FIG. 2). The predetermined operation can be normal operation of the die 208. The gate of the MOS device 308 can be connected to a system voltage VCC during normal operation of the die 208 (FIG. 2) such that the part pad 228 and the associated die 208 (FIG. 2) are isolated from the resistive and capacitive load associated with the receiving device 302 and associated conductive lines or traces during normal operation of the die 208.

Figure 4:
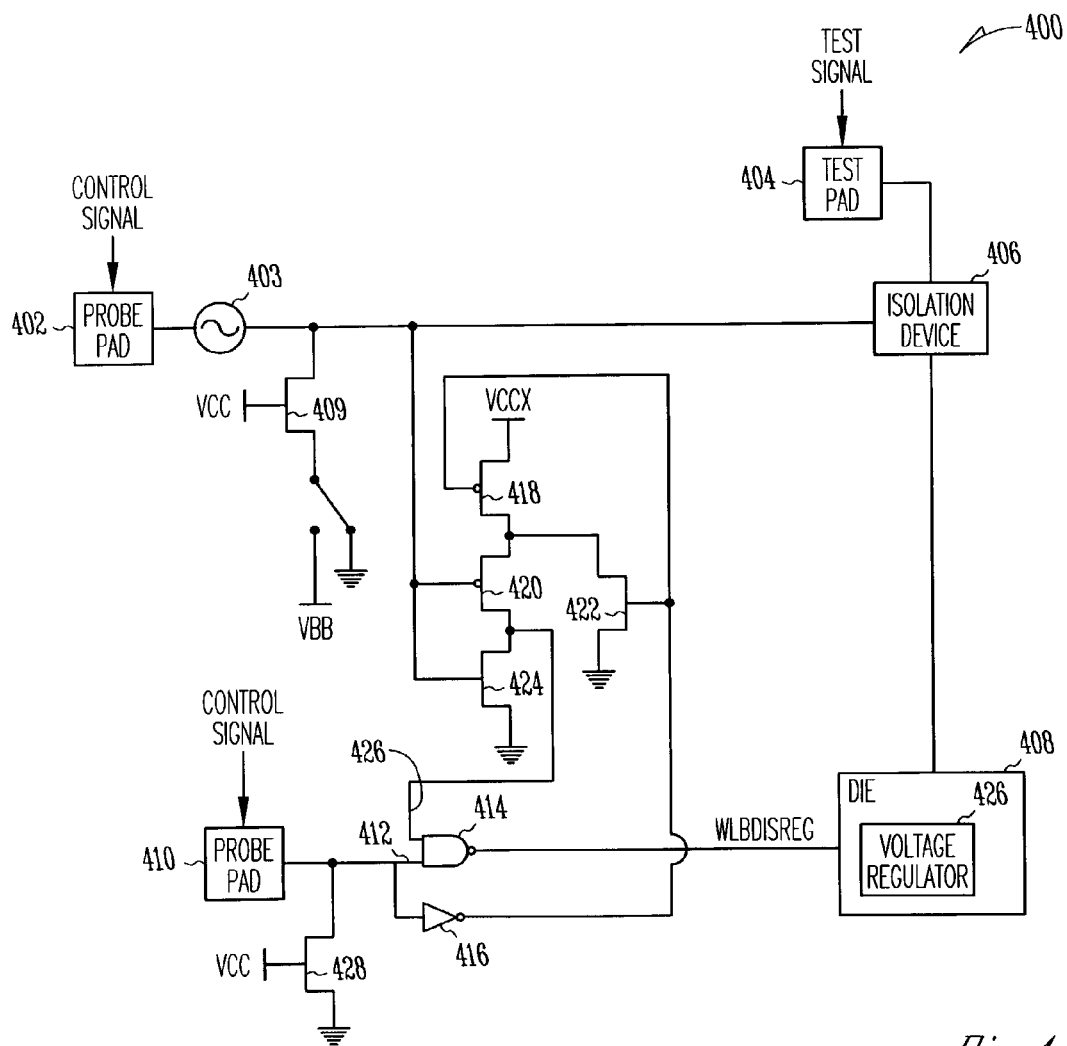
FIG. 4 is block diagram of an isolation control circuit in accordance with an embodiment of the present invention.

FIG. 4 is block diagram of an isolation control circuit 400 that can be used for the isolation control circuit 224 in FIG. 2. The isolation control circuit 400 includes a first probe pad 402 adapted to receive a isolation control signal. A RFID, fuse control device or the like can be substituted for the probe pad 402. The probe pad 402 can be coupled to a programmable device 403. In the embodiment shown in FIG. 4, the programmable device 403 is a fuse type device, but can also be an anti-fuse type device, a metal oxide semiconductor (MOS) type device, a multiplexor, a conductive jumper, a ball-bond or the like. The programmable device 403 can be connected to an isolation device 406 similar to the isolation device 222A in FIG. 2 to control application of a test signal from a test pad 404 to a die 408 similar to the die 208 of FIG. 2. If the die 408 is bad or defective, the programmable device 403 or fuse type device can be programmed by blowing the fuse or operating the device 403 to open the circuit to prevent the isolation control signal from activating the isolation device 406 and coupling the test pad 404 to the die 408. The programmable device 403 and the isolation device 406 can be connected to a MOS device 409 or the like to prevent the isolation device 406 from operating or being active and coupling the test pad 404 to the die 408 during a predetermined use or normal operation of the die 408. The MOS device 409 can be an N-channel transistor, P-channel transistor or the like. In the example shown in FIG. 4, the MOS device 409 and the isolation device 406 can each be an N-channel transistor and a gate of the N-channel MOS device 409 can be connected to a supply or system voltage VCC during normal operation of the die 408 to activate the N-channel MOS device 409 to connect a gate of the isolation device 406 to ground potential or to a voltage less than ground potential VBB during the predetermined use or normal use of the microelectronic die 408 to prevent the isolation device 406 from operating or being active and coupling the test pad 404 to the die 408. The test pad 404 and associated conductive line or trace can represent a significant resistive and capacitive load on the die 408 if inadvertently coupled to the die 408 during normal operation of the die 408.

In the embodiment shown in FIG. 4, the isolation circuit 400 also includes a second probe pad 410 adapted to receive another control signal. A RFID, fuse control device or the like can be substituted for the probe pad 410. The second probe pad 410 is connected to one input 412 of an NAND gate 414 and to an inverter 416. An output of the inverter 416 is coupled to a gate of a first P-channel transistor 418. In the embodiment of FIG. 4, a first source/drain terminal of the first P-channel transistor 418 is connected to a high voltage potential VCCX. A second source/drain terminal of the first P-channel transistor 418 is connected to a first source/drain of a second P-channel transistor 420 and to a first source/drain of a first N-channel transistor 422. A gate of the first N-channel transistor 422 is connected to the output of the inverter 416 and a second source/drain terminal of the first N-channel transistor 422 can be connected to ground potential. A gate of the second P-channel transistor 420 is connected to the programmable device 404 and the isolation device 406. A second source/drain terminal of the second P-channel transistor 420 is connected to a first source/drain terminal of a second N-channel transistor 424 and to a second input 426 of the NAND gate 414. A gate of the second N-channel transistor 424 is connected to the programmable device 404 and the isolation device 406 and a second source/drain terminal of the second N-channel transistor 424 can be connected to ground potential. The output of the NAND gate 414 provides the wafer level burn-in voltage regulator disconnect signal WLBDisReg to turn off power to a voltage regulator 426 associated with the microelectronic die 408 when the WLBDisReg is a low signal to prevent power from being applied to the different components formed on the die 408, if the die 408 is defective. The voltage regulator 426 is shown in FIG. 4 as being formed on the die 408 but the voltage regulator 426 could also be formed in a scribe area similar to scribe area 104 in FIG. 1 and the power from the regulator 426 can be bused to the die 408.

In operation, if the die 408 is defective, the programmable device 403 is blown or operated as previously discussed to open the circuit between the probe pad 402 and the isolation device 406. Accordingly, the ISO signal will be low and the second P-channel transistor 420 will be turned on and the second N-channel transistor 424 will be off. A high control signal on probe pad 410 provides a high signal at the first input 412 to the NAND gate 414 and the output signal of the inverter 416 will be low. The low output signal from the inverter 416 causes the first P-channel transistor 418 to be turned on and the first N-channel transistor 422 to be turned off. With the first and second P-channels transistors 418 and 420 turned on, a high potential, VCCX, is applied to the second input 426 of the NAND gate 414. With both inputs 412 and 426 of the NAND gate 414 high, the output signal of the NAND gate 414 which corresponds to the signal WLBDisReg will be low to turn off the voltage regulator 426 and prevent power from being applied to the die 408.

In contrast, if the die 408 is good, the programmable device 403 is not blown or activated and a high isolation control signal applied to the probe pad 402 by a testing device (not shown in FIG. 4) is coupled to the isolation device 406 to activate the N-channel MOS device 406 and pass the test signal to the die 408. If the ISO signal is high, then the second P-channel transistor 420 is turned off and the second N-channel transistor 424 is turned on to apply ground potential or a low signal to the second input 426 of the NAND gate 414. The output signal (WLBDisReg) of the NAND gate 414 will then be a high signal to turn on the voltage regulator 426 to supply power to the die 408.

The first input 412 of the NAND gate 414 can be coupled to a MOS device 428. The MOS device 428 can be an N-channel transistor, a P-channel transistor or the like. In the example shown in FIG. 4, the MOS device is an N-channel transistor including one source/drain terminal connected to the first input 412 of the NAND gate 414 and another source/drain terminal connected to ground potential. A supply or system voltage VCC can be applied to the gate of the N-channel MOS device 428 to activate the device 428 and couple the first input 412 to ground potential during normal operation of the die 408, if the die 408 is good. The low signal on the first input 412 causes the output signal (WLBDisReg) of the NAND gate 414 to be a high signal to activate the voltage regulator 426 and supply power to the die 408.

It should be noted that the N-channel MOS devices or transistors and the P-channel MOS devices or transistors in FIG. 4 can be interchanged with the appropriate voltage level being applied to either activate or inactivate the transistor as the case may be for proper operation of the circuit as described above.

Figure 5:
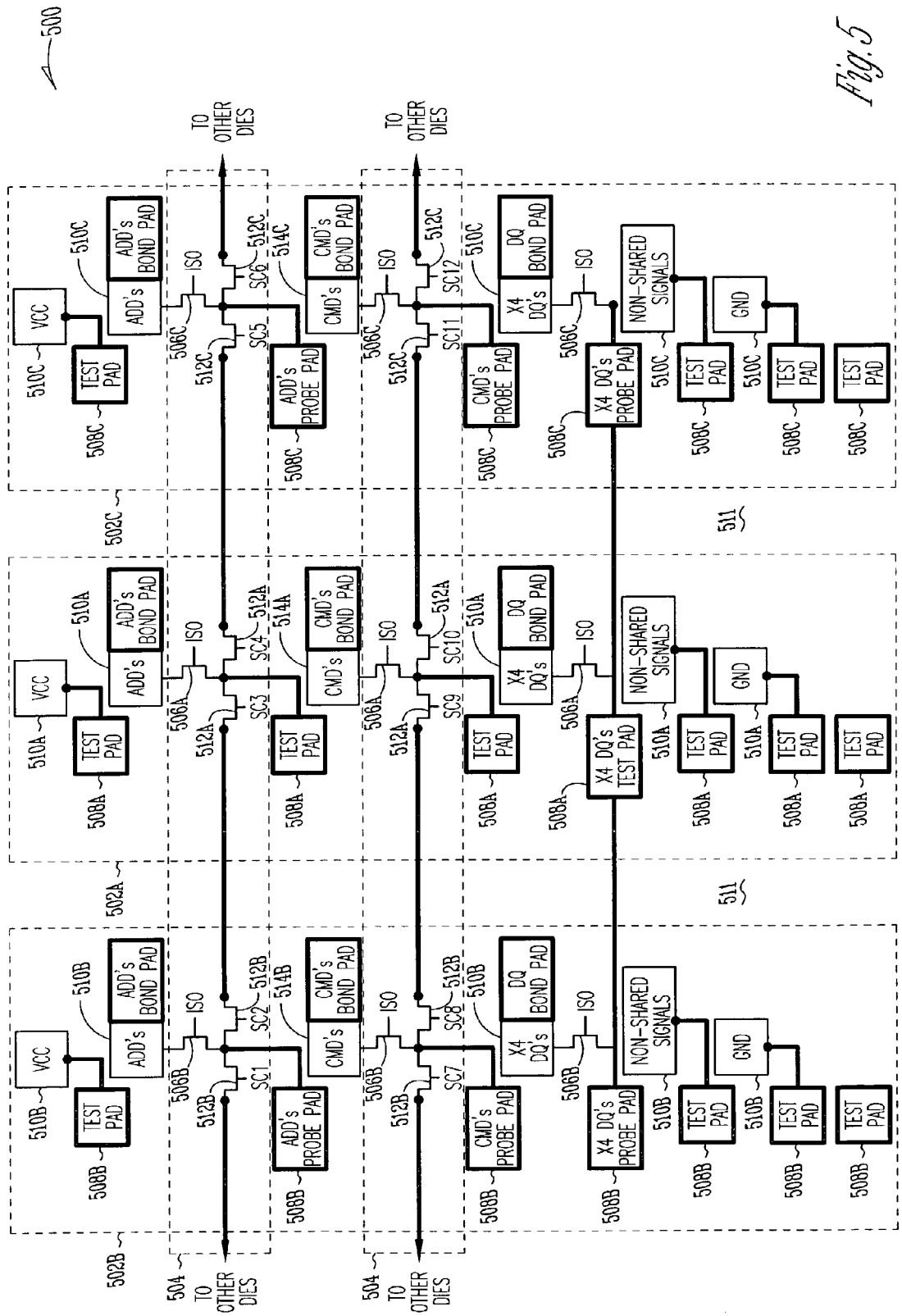
FIG. 5 is an illustration of a portion of a semiconductor wafer including a plurality of microelectronic dies and signal sharing circuits and isolation circuits in accordance with an embodiment of the present invention.

FIG. 5 is an illustration of a portion of a semiconductor wafer 500 similar to the wafer 100 of FIG. 1 including a plurality of microelectronic dies, e.g., 502A, 502B and 502C, signal sharing circuits 504 and isolation circuits, e.g., 506A, 506B and 506C in accordance with an embodiment of the present invention. The isolation circuits 506 can be similar to the isolation circuits 202 in FIG. 2. In the example shown in FIG. 5, the dies 502A, B and C can be memory systems, processors or the like. Each of the microelectronic dies 502A, B and C can have a plurality of test or signal probe pads 508, e.g., 508A, 508B and 508C, adapted to receive different types of signals to operate or test different components formed on each of the dies 502A, B and C. Examples of the different test probe pads 508A, B and C include power pads to receive a supply or system voltage VCC; address pads or ADD's probe pads to receive address type signals; command pads or CMD's probe pads to receive command type signals; data input/output pads or DQ's probe pads to read and write data; and ground pads for coupling each die to ground potential. Each of the test pads 508A, B and C can be coupled to an associated part pad 510A, B and C. The part pad 510 can be actually coupled to the component formed on the die 502. The test pads 508A, B and C shown with heavy borders and the bold interconnecting lines or traces between sharing devices 512 of the sharing circuits 504 can be formed in a redistribution layer (RDL) or any interconnect layer of conductive material capable of being processed to form the electrical interconnections between components. The sharing circuits 504 can be formed in an RDL or interconnect layer to provide a medium of conductive lines associated with the sharing circuits 504 to interconnect the dies 502 across the scribe areas 511. The part pads 510 and the sharing devices 512 that are not shown in bold or with heavy borders are formed on the dies 502. As shown in the example in FIG. 5, the test pads 508 for the address (ADD's) and command (CMD's) type signals are connected to sharing circuits 504 that permit the address and command test signals to be shared either left or right or in both directions across multiple dies 502 by programming or selectively operating the sharing devices 512 similar to the sharing devices 206 as previously discussed with respect to FIG. 2. While the other type test pads 508 are not shown as being connected to a signal sharing circuit 504, these test pads 508 could also be adapted to share their respective test signals in one direction or the other across multiple dies 502. The data input/output (DQ's) probe pads 508 can be hard wired by the redistribution layer (RDL) as shown in the example of FIG. 5 to share a test signal applied to the DQ test pad 508A to the DQ probe pads 508B and 508C of dies 502B and 502C, respectively, or a signal sharing circuit similar to signal sharing circuits 504 can be formed in association with the DQ probe pads 508.

In the example shown in FIG. 5, test signals for the address (ADD's) and command (CMD's) type signals need only be applied to the test pads 508A associated with the ADD's part pad 510A and CMD's part pad 514A of the first die 502A. The test signals can then be selectively shared with the adjacent dies 502B and 502C and with other dies (not shown in FIG. 5) by programming the sharing circuits 504 to share either left or right or in both directions. In FIG. 5, the test pads 508 are shown as being formed on each of dies 502.

In FIG. 5, the test pads 508A, B and C for the power signals are shown as being connected directly to the power pads VCC 510A, B and C. The test pads 508A, B and C for power signals can also be interconnected using a sharing circuit similar to sharing circuits 504 and an isolation circuits similar to isolation circuits 506A, B and C; however, the sharing devices 512 and isolation device used for isolation circuit 506 would need to be much larger and have a higher voltage and current carrying capacity to handle the power signals compared to the devices 512 and 506 used to carry test signals or other signals.

Figure 6:
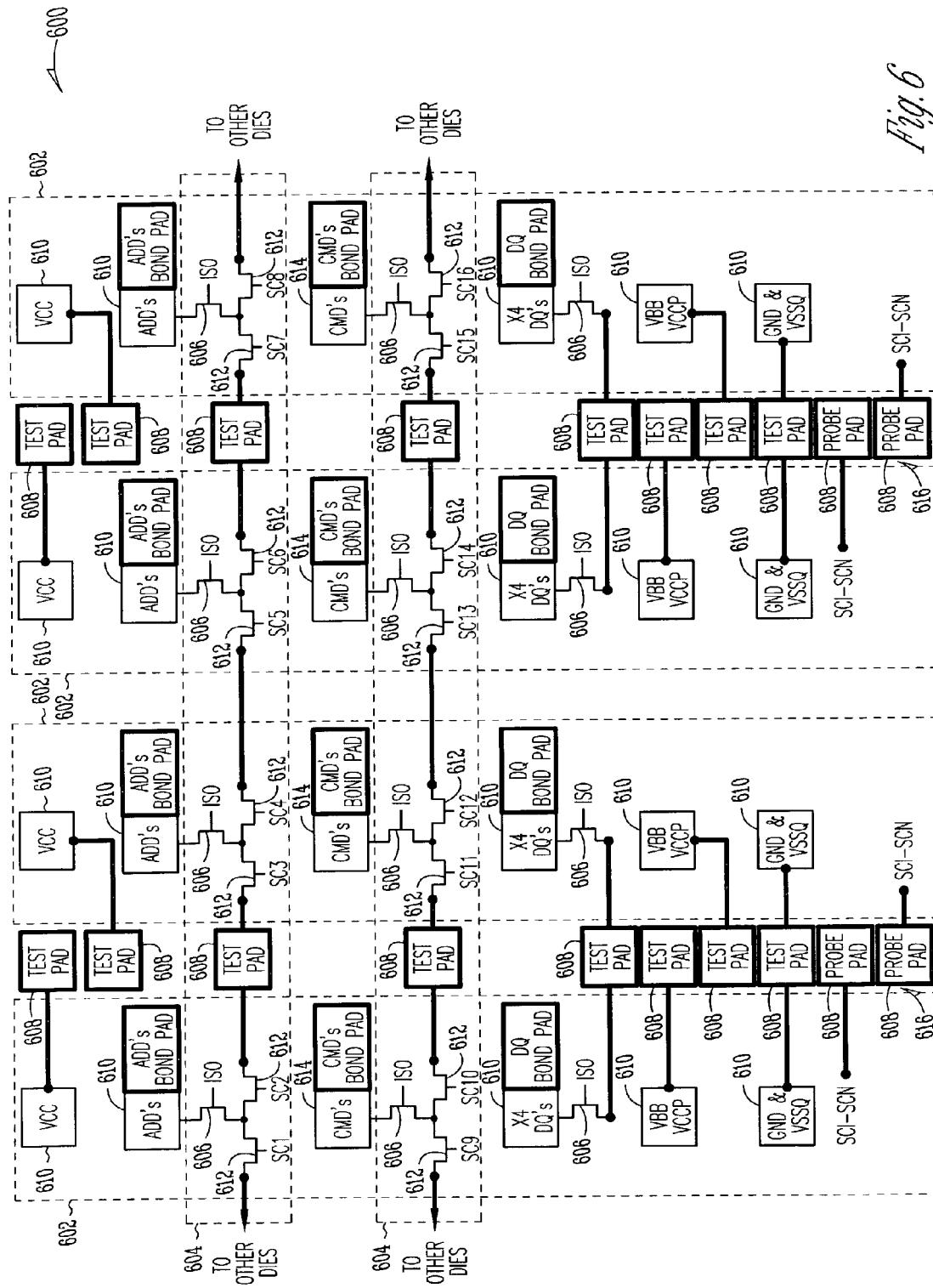
FIG. 6 is an illustration of a portion of a semiconductor wafer including a plurality of microelectronic dies and signal sharing circuits and isolation circuits in accordance with another embodiment of the present invention.

FIG. 6 is an illustration of a portion of a semiconductor wafer 600 including a plurality of microelectronic dies 602, signal sharing circuits 604 and isolation circuits 606 in accordance with another embodiment of the present invention. In this embodiment, the test pads 608 can be formed in a scribe 616 between the dies 602. A test signal applied to the test pads 608 associated with the ADD's part pads 610 and CMD's part pads 614 can be selectively shared by operating the appropriate sharing devices 612 to share the test signals either to the left or to the right or in both directions between the dies 602 interconnected by each of the signal sharing circuits 604. The isolation circuits 606 can be similar to the isolation circuits 202 or devices 222 of FIG. 2.

Figure 7:
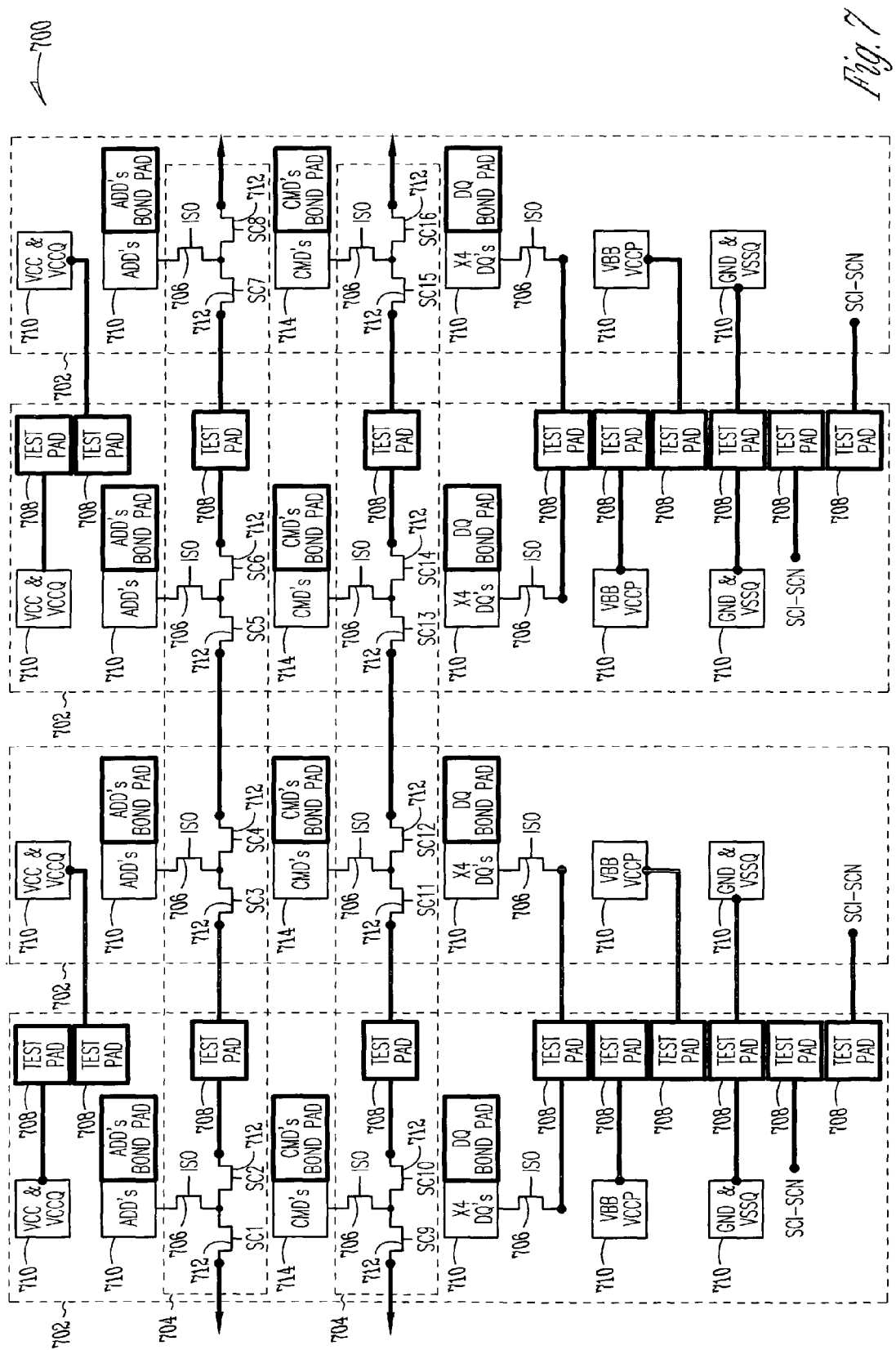
FIG. 7 is an illustration of a portion of a semiconductor wafer including a plurality of microelectronic dies and signal sharing circuits and isolation circuits in accordance with a further embodiment of the present invention.

FIG. 7 is an illustration of a portion of a semiconductor wafer 700 including a plurality of microelectronic dies 702 and signal sharing circuits 704 and isolation circuits 706 in accordance with a further embodiment of the present invention. In this embodiment, the test pads 708 can be formed on one of the dies 702. A test signal applied to the test pads 708 associated with the ADD's part pads 710 and CMD's part pads 714 can be selectively shared by operating the appropriate sharing devices 712 to share the test signals either to the left or to the right or in both directions between the dies 702 interconnected by each of the signal sharing circuits 704.

Figure 8:
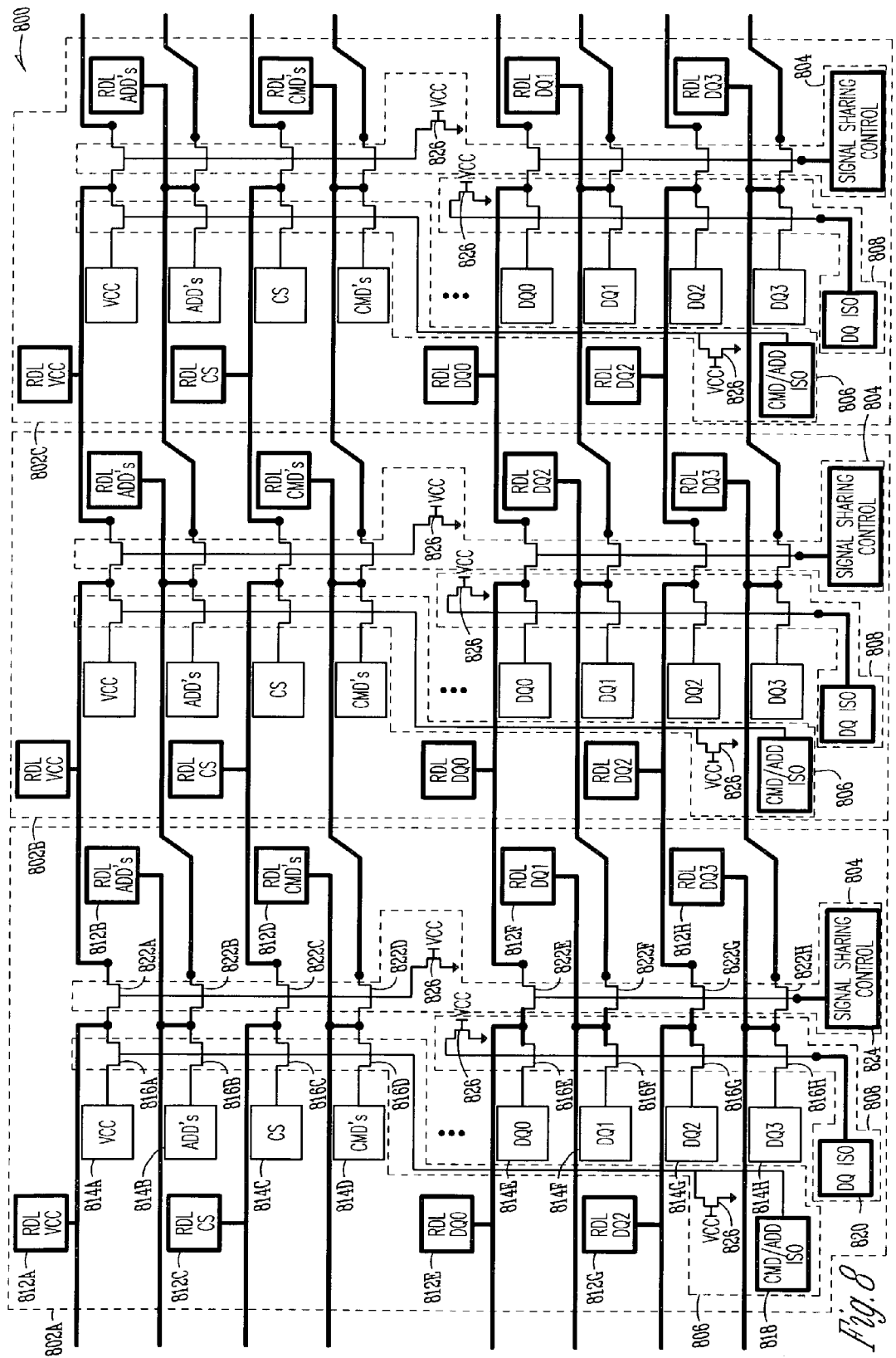
FIG. 8 is an illustration of a portion of a semiconductor wafer including a plurality of microelectronic dies and signal sharing circuits and isolation circuits in accordance with a further embodiment of the present invention.

FIG. 8 is an illustration of a portion of a semiconductor wafer 800 including a plurality of microelectronic dies 802A, B and C and signal sharing circuits 804. Each microelectronic die 802 includes a command/address (CMD/ADD), power (VCC) and ground isolation circuit 806 and a data input/output (DQ) isolation circuit 808 in accordance with a further embodiment of the present invention. Each die 802 can include an associated signal sharing circuit 804, an associated command/address isolation circuit 806 and an associated data input/output isolation circuit 808. Each die 802 can also include a plurality of test pads 812 to receive different test signals or other types of signals. The test pads 812 and associated conductive line and traces can be formed in a redistribution layer (RDL) as represented by these pads being shown with bold borders or in bold in FIG. 8. Examples of the test pads 812 formed in an RDL can include: an RDL VCC test pad 812A to receive a system voltage; an RDL ADD's test pad 812B to receive an address test signal; an RDL CS test pad 812C to receive a CS signal; an RDL CMD's 812D to receive a command test signal; and a plurality of input/output test pads, RDL DQ0–DQ3 812E–812H to receive test input signals or to evaluate test output signals. Each of the test pads 812 can be coupled to an associated part pad 814 by an associated isolation device 816. The isolation device 816 can be an MOS device, such as an N-channel transistor, a P-channel transistor or a similar type device. The isolation devices 816A–816D associated respectively with the VCC part pad 814A, ADD's part pad 814B, CS part pad 814C and CMD's part pad 814D can be controlled by a command/address (CMD/ADD) isolation control signal received by a command/address isolation (CMD/ADD ISO) control pad 818. The CMD/ADD ISO control signal can be generated by an isolation control circuit (not shown in FIG. 8) similar to the isolation control circuit 400 shown in FIG. 4. The isolation devices 816E–816H associated respectively with the DQ0–DQ3 part pads 814E–814H can be controlled by a DQ ISO control signal applied to a DQ ISO control pad 820. The DQ ISO control pad can receive the control signal from an isolation control circuit (not shown in FIG. 8) similar to the control circuit 400 shown in FIG. 4. In the example shown in FIG. 8, the isolation devices 816 are N-channel transistors. P-channel transistors can be used as well with the appropriate voltage levels being applied to turn on or off the transistors for proper operation of the circuit. Accordingly, a high isolation control signal applied to the CMD/ADD ISO control pad 818 and to the DQ ISO control pad 820, the N-channel isolation devices 816 will be turned on to couple any test signals applied to the test pads 812 to the respective associated part pads 814.

Each test pad 812 can also be coupled to an associated sharing device 822 to share any test signal applied to the test pad 812 with other dies 802 in response to a share control signal. The share control signal can be applied to a signal sharing control pad 824 by a signal sharing control circuit (not shown in FIG. 8) that can be similar to the sharing control circuit 300 of FIG. 3. The signal sharing devices 822 can each be an MOS device or the like. In the example shown in FIG. 8, the MOS signal sharing devices 822 are N-channel transistors but can also be P-channel transistors with the appropriate voltage or control signal being applied to the turn the P-channel sharing devices on and off. Accordingly, a high applied to the signal sharing control pad 824 will cause the N-channel sharing devices 822 to turn on to share any test signals applied to the respective test pads 812 with other dies 802.

The CMD/ADD ISO control pad 818, the DQ ISO control pad 820 and the signal sharing control pad 824 can each be coupled to a device 826 to connect gates of the sharing devices 822 and the isolation devices 816 to ground potential during a predetermined or normal operation of the microelectronic die 802 to prevent the resistive and capacitive load associated with the test pads 812 and associated conductive lines or traces from being coupled to the die 802 and effecting the die's normal operation. The device 826 can be an MOS device such as an N-channel transistor as shown in the example of FIG. 8. The device 826 can have one source/drain terminal coupled to the gates of the sharing devices 822 and isolation devices 816 and the other source/drain terminal coupled to ground potential. The gate of the device 826 can be coupled to a system or supply voltage VCC. Accordingly, the gates of the isolation devices 816 and sharing devices 822 are connected to ground potential to prevent the isolation devices 816 and sharing devices 822 from operating and thereby preventing the test pads or signal pads 812 and associated conductive lines or traces from being coupled to the die 802 when the system voltage VCC is applied to the die 802 during normal operation of the die 802.

Figure 9:
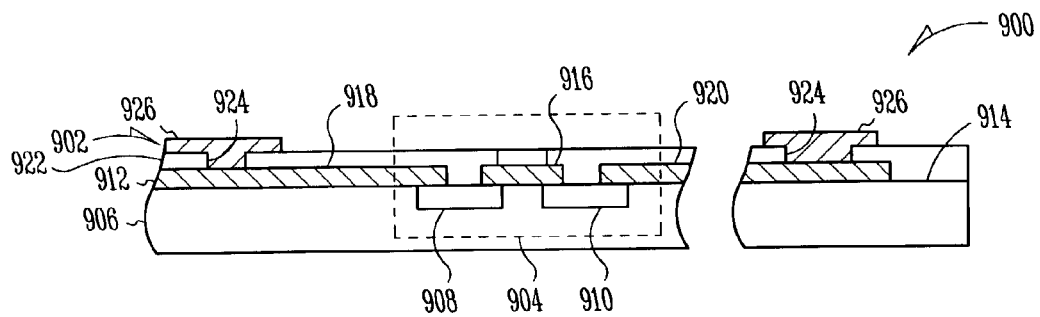
FIG. 9 is a cross-sectional view of a wafer or substrate showing a redistribution layer (RDL) or interconnect layer in accordance with an embodiment of the present invention.

FIG. 9 is a cross-sectional view of a portion of a semiconductor wafer 900 showing a redistribution layer (RDL) or processable interconnect layer 902 in accordance with an embodiment of the present invention. As previously discussed, the test or signal pads 508 in FIG. 5, 608 in FIG. 6, 708 in FIG. 7 and 812 in FIG. 8 and the associated interconnecting conductive lines or traces shown in bold in the Figures, can be formed in a RDL or processable interconnect layer to make contact with devices or components, such as a device 904 formed on a substrate 906 of the semiconductor wafer 900. As an example in FIG. 9, the device or component 904 can be a MOS device including a first source/drain region 908 and a second source/drain region 910 formed in the substrate 906. A first layer 912 of conductive material or metallization can be formed on a surface 914 of the substrate 906 and selectively patterned to form a gate electrode 916, a first source/drain electrode 918 in contact with the first source/drain region 908 and a second source/drain electrode 920 in contact with the second source/drain region 910. A layer 922 of insulation material can be formed over the first layer 912 of conductive material. The interconnect layer 902 can be formed by forming vias 924 in the layer 922 of insulation material at selected locations to make contact with the underlying devices or components 904. Conductive pads 926 can then be formed at each of the vias 924. The conductive pads 926 are similar to the conductive pads 508 of FIG. 5, 608 in FIG. 6, 708 in FIG. 7 and 812 in FIG. 8 and provide probe points or locations where electrical signals can be applied or measured during testing operations or for other purposes.

Figure 10:
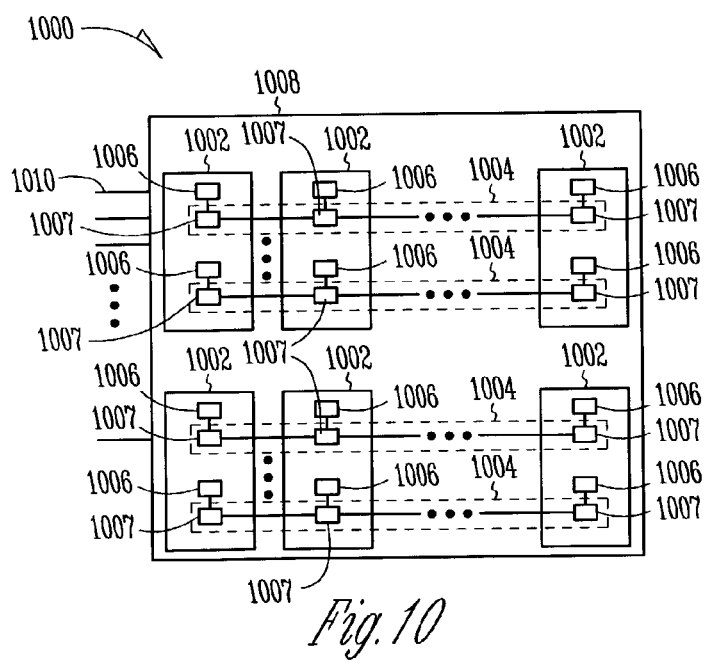
FIG. 10 is a block schematic diagram of a circuit module including microelectronic dies having signal sharing circuits and isolation circuits in accordance with an embodiment of the present invention.

FIG. 10 is a block schematic diagram of a circuit module 1000, in accordance with an embodiment of the present invention, including microelectronic dies 1002 with signal sharing circuits 1004 and isolation circuits 1006, similar to the signal sharing circuits and isolation circuits previously described in FIGS. 2–8. Only the sharing devices 1007 of the sharing circuits 1004 are represented in FIG. 10 for purposes of clarity. A group of microelectronic dies 1002 can be cut from a single wafer to form a module 1000 mounted on a printed circuit board (PCB) 1008 with the signal sharing circuits 1004 and isolation circuits 1006 in tact. The PCB 1008 on which the module 1000 can be mounted can be reduced in size by implementing the present invention because the dies 1002 forming the module 1000 are already interconnected by the sharing circuits 1004 which can be formed in an interconnect layer or RDL as previously described with respect to FIGS. 5–9 and additional real estate or surface area on the PCB 1008 does not need to be provided for the formation of signal traces or routes to interconnect the dies 1002. As shown in FIG. 10, two or more dies 1002 can be combined, with or without a protective casing, into the circuit module 1000 to enhance or extend the functionality of an individual die 1002. Circuit module 1000 can be a combination of dies 1002 representing a variety of functions, or a combination of dies 1002 containing the same functionality. Some examples of a circuit module 1000 include memory modules, device drivers, power modules, communication modems, processor modules and application-specific modules and can include multi-layer, multi-chip modules. Circuit module 1000 can be a sub-component of a variety of electronic systems, such as a clock, a television, a cell phone, a personal computer, an automobile, an industrial control system, an aircraft and others. Circuit module 1000 can have a variety of leads 1010 extending therefrom providing unilateral or bilateral communication and control.

Figure 11:
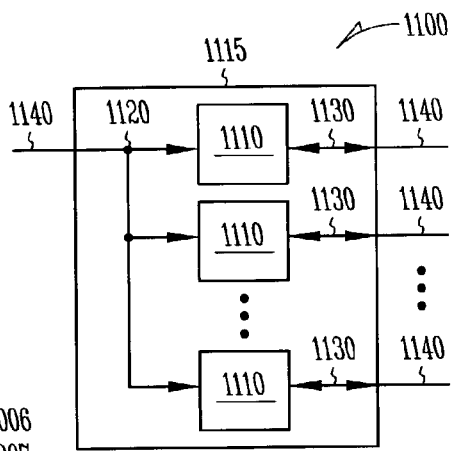
FIG. 11 is a block schematic diagram of a memory module including microelectronic dies with signal sharing circuits and isolation circuits in accordance with an embodiment of the present invention.

FIG. 11 shows one embodiment of a circuit module as a memory module 1100 including signal sharing circuits and isolation circuits similar to those previously described with reference to FIGS. 2–8. Memory module 1100 generally depicts a Single In-line Memory Module (SIMM) or Dual In-line Memory Module (DIMM). A SIMM or DIMM can generally be a printed circuit board (PCB) or other support containing a series of memory devices. While a SIMM will have a single in-line set of contacts or leads, a DIMM will have a set of leads on each side of the support with each set representing separate I/O signals. Memory module 1100 contains multiple memory devices 1110 contained on support 1115, the number depending upon the desired bus width and the desire for parity. Memory module 1100 can contain memory devices 1110 on both sides of support 1115. Memory module 1100 accepts a command signal from an external controller (not shown) on a command link 1120 and provides for data input and data output on data links 1130. The command link 1120 and data links 1130 are connected to leads 1140 extending from the support 1115. Leads 1140 are shown for conceptual purposes and are not limited to the positions shown in FIG. 11.

Figure 12:
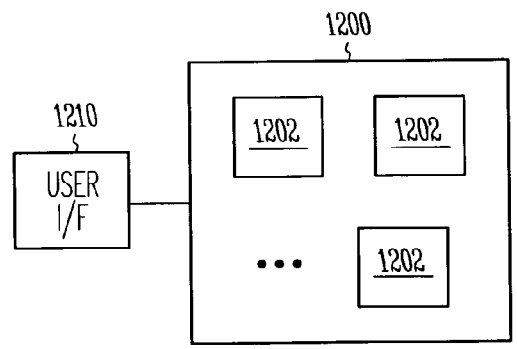
FIG. 12 is a block schematic diagram of an electronic system including signal sharing circuits and isolation circuit in accordance with another embodiment the present invention.

FIG. 12 shows an electronic system 1200 containing one or more circuit modules 1202 similar to circuit module 1100 (FIG. 11) and including signal sharing circuits and isolation circuits, such as the signal sharing circuit 200 and isolation circuit 202 (FIG. 2) of the present invention. Electronic system 1200 generally contains a user interface 1210. User interface 1210 provides a user of the electronic system 1200 with some form of control or observation of the results of the electronic system 1200. Some examples of user interface 1210 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1210 can further describe access ports provided to electronic system 1200. Access ports are used to connect an electronic system to the more tangible user interface components previously exemplified. One or more circuit modules 1202, such as the circuit modules 1100 in FIG. 11, can be a processor providing some form of manipulation, control or direction of inputs from or outputs to user interface 1210, or of other information either preprogrammed into, or otherwise provided to, electronic system 1200. As will be apparent from the lists of examples previously given, electronic system 1200 will often contain certain mechanical components (not shown) in addition to the circuit modules 1202 and user interface 1210. It will be appreciated that the one or more circuit modules 1202 in electronic system 1200 can be replaced by a single integrated circuit. Furthermore, electronic system 1200 can be a sub-component of a larger electronic system.

Figure 13:
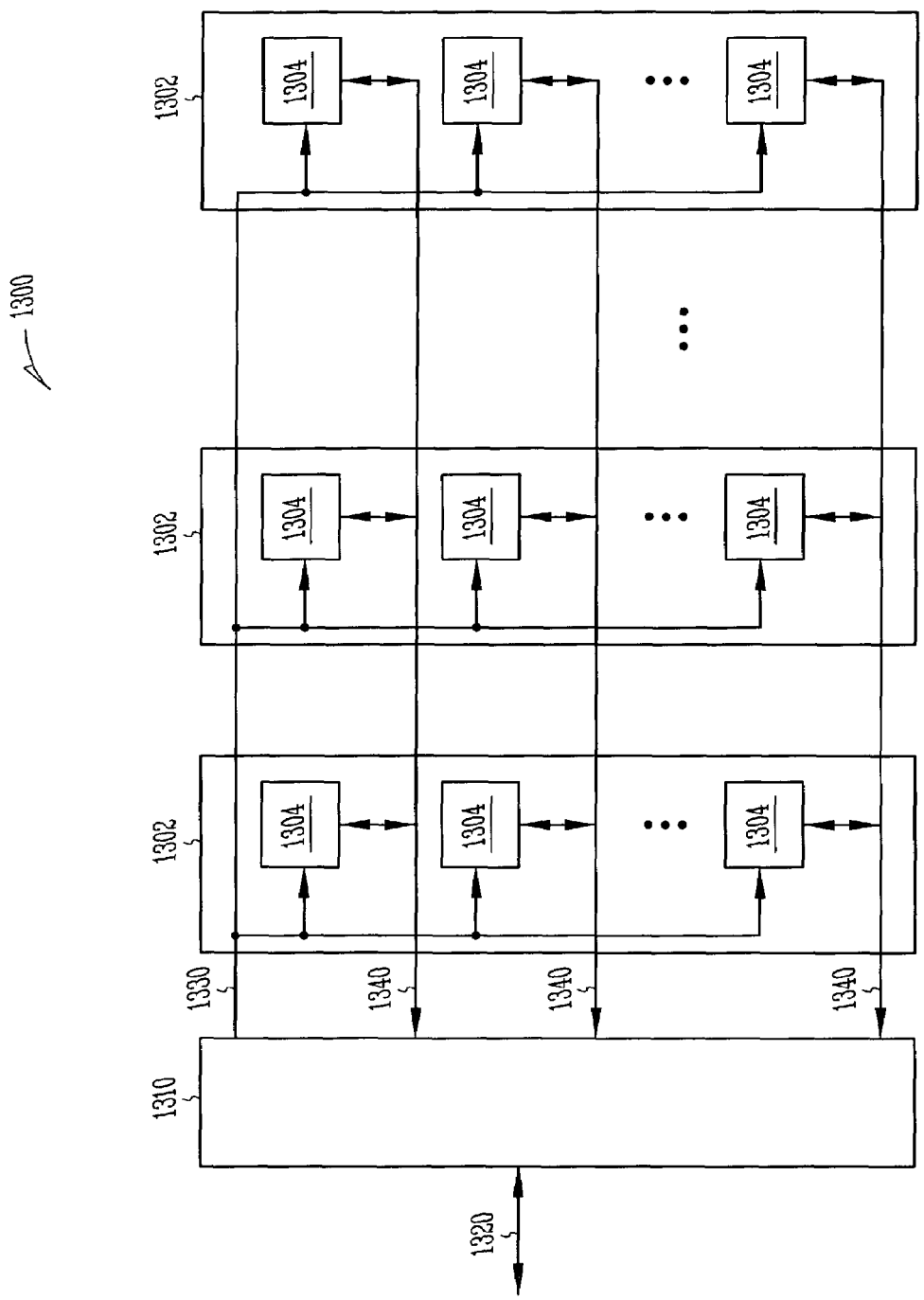
FIG. 13 is a block schematic diagram of a memory system including microelectronic dies with signal sharing circuits and isolation circuits in accordance with an embodiment of the present invention.

FIG. 13 shows one embodiment of an electronic system as memory system 1300. Memory system 1300 contains one or more memory modules 1302 similar to memory modules 1100 in FIG. 11 and including signal sharing circuits and isolation circuits, such as signal sharing circuit 200 isolation circuit 202 (FIG. 2) in accordance with the present invention. A memory controller 1310 provides and controls a bidirectional interface between memory system 1300 and an external system bus 1320. Memory system 1300 accepts a command signal from the external bus 1320 and relays it to the one or more memory modules 1304 on a command link 1330. Memory system 1300 provides for data input and data output between the one or more memory modules 1304 and external system bus 1320 on data links 1340.

Figure 14:
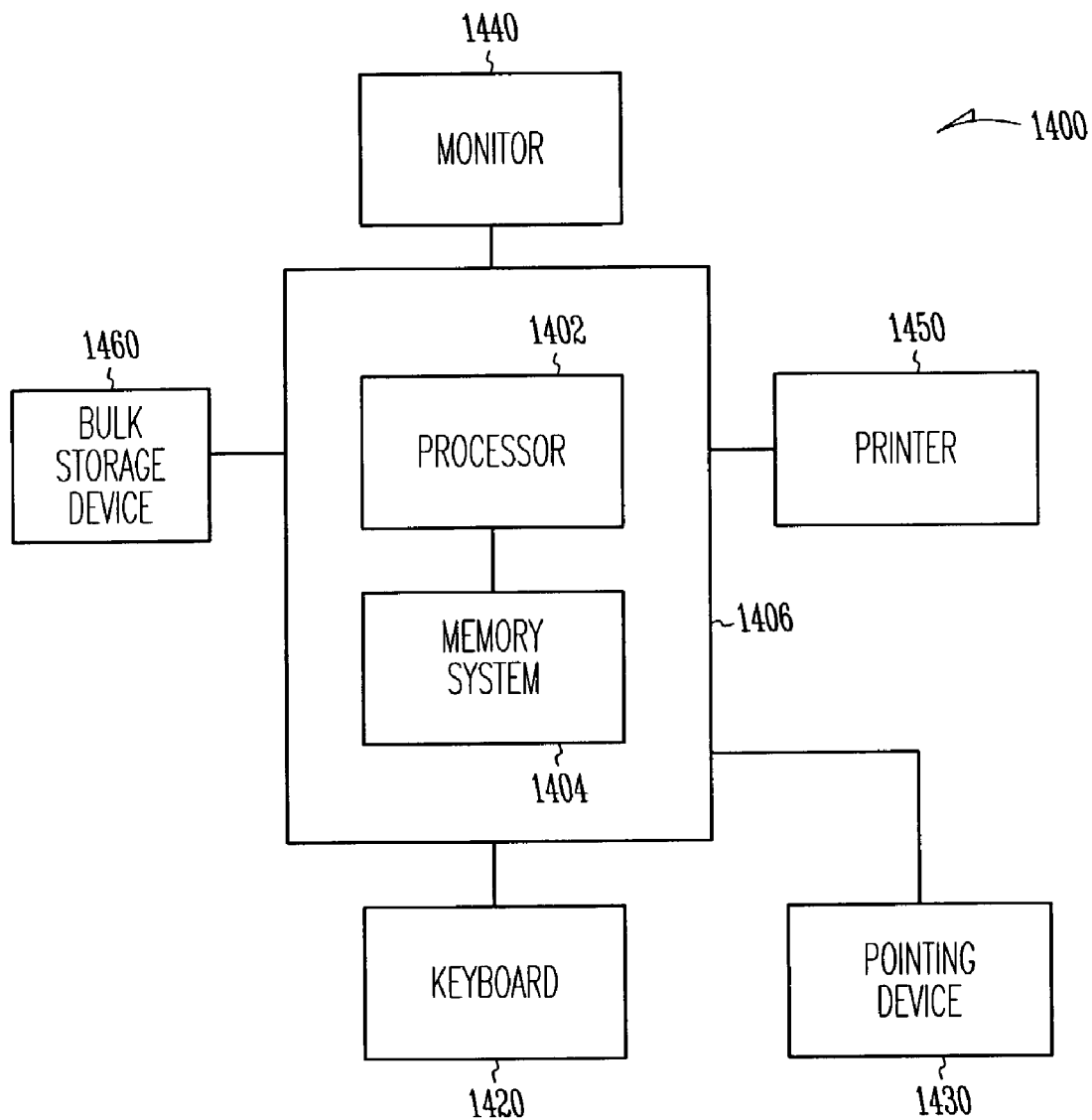
FIG. 14 is a block schematic diagram of a computer system including signal sharing circuits and isolation circuits in accordance with an embodiment of the present invention.

FIG. 14 shows a further embodiment of an electronic system as a computer system 1400. Computer system 1400 contains a processor 1402 and a memory system 1404 similar to memory system 1300 of FIG. 13. The processor 1402 and the memory system 1404 can be housed in a computer unit 1405. Computer system 1400 is but one example of an electronic system containing another electronic system, i.e. memory system 1404. The processor 1402 and the memory system 1404 can include signal sharing circuits and isolation circuits in accordance with the present invention, such as the signal sharing circuit 200 and isolation circuit 202 in FIG. 2. Computer system 1400 optionally contains user interface components. Depicted in FIG. 14 are a keyboard 1420, a pointing device 1430, a monitor 1440, a printer 1450 and a bulk storage device 1460. It will be appreciated that other components are often associated with the computer system 1400 such as modems, device driver cards, additional storage devices, etc. It will further be appreciated that the processor 1402 and the memory system 1404 of the computer system 1400 can be incorporated on a single integrated circuit and can use the isolation circuits of the present invention.

CONCLUSION

The present invention thus provides a signal sharing circuit or device that is programmable to selectively share a test signal, power, ground or other signals in different directions across multiple microelectronic dies or between selected dies. The signal sharing circuits permit minimizing the signal routes across a module or wafer and thus permits a reduction in size of a printed circuit board on which the module or modules can be formed. Additionally, the present invention provides a circuit or device to isolate a defective die to prevent a shared signal from being impacted by the defective die and thereby adversely effecting the operation or testing of other dies to which the shared signal is applied. Additionally, the present invention provides a circuit or device to prevent a test pad or other type pad from being coupled to an associated microelectronic die during normal operation of the die or during operation of the die other than when the pad is needed to apply a test signal or another signal. Further, the present invention provides a method for testing multiple dies on a wafer where the test signal can be selectively shared in different directions across multiple dies or between selected dies. The present invention also provides a circuit and method that permits a reduction of tester resources, permits fewer probe touch downs and allows a tester or test apparatus to test more dies simultaneously.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. A signal sharing circuit, comprising:
   a first pad adapted to receive a signal;
   a first sharing device associated with a first microelectronic die and adapted to selectively share the signal with at least a second microelectronic die on one side adjacent to and in series with the first microelectronic die in response to a first share control signal; and
   a programmable element connected to the first sharing device to electrically isolate the second microelectronic die from the signal.

2. The signal sharing circuit of claim 1, further comprising a second sharing device associated with the first microelectronic die and adapted to selectively share the signal with at least a third microelectronic die on another side of the first microelectronic die in response to a second share control signal.

3. The signal sharing circuit of claim 2, further comprising:
   a part pad coupled to each microelectronic die; and
   an isolation device associated with each microelectronic die and adapted to apply the signal to the part pad of each microelectronic die in response to an associated isolation control signal.

4. The signal sharing circuit of claim 3, further comprising:
   a third sharing device associated with the second microelectronic die and adapted to couple the signal to the isolation device associated with the second microelectronic die in response to a third share control signal; and
   a fourth sharing device associated with the second microelectronic die and adapted to selectively share the signal with at least one other microelectronic die on another side of the second microelectronic die from the first microelectronic die in response to a fourth share control signal.

5. The signal sharing circuit of claim 4, further comprising:
   a fifth sharing device associated with the third microelectronic die and adapted to couple the signal to the isolation device associated with the third microelectronic die in response to a fifth share control signal; and
   a sixth sharing device associated with the third microelectronic die and adapted to selectively share the signal with at least one other microelectronic die on another side of the third microelectronic die from the first microelectronic die in response to a sixth share control signal.

6. A signal sharing circuit, comprising:
   a pad adapted to receive one of a signal, power or ground potential;
   a plurality of sharing devices, at least one sharing device associated with each one of a plurality of microelectronic dies to selectively share the signal, power or ground potential with other dies of the plurality of microelectronic dies connected in series with the each one of a plurality of microelectronic dies; and
   a programmable element connected to the one sharing device to permanently isolate a first of the plurality of microelectronic dies from a second of the plurality of microelectronic dies.

7. A signal sharing circuit, comprising:
   a first pad adapted to receive a signal;
   a part pad coupled to a first microelectronic die;
   an isolation device adapted to transfer the signal from the first pad to the part pad in response to an isolation control signal; and
   a programmable element connected to the isolation device to electrically isolate a second microelectronic die from the signal; and
   a sharing device to pass the signal to at least the second microelectronic die on one side of the first microelectronic die in response to a share control signal.

8. The signal sharing circuit of claim 7, further comprising another sharing device to share the signal with at least a third microelectronic die on another side of the first microelectronic die in response to another share control signal.

9. The signal sharing circuit of claim 7, further comprising at least one other isolation device associated with at least one other microelectronic die and adapted to couple the signal to the other microelectronic die in response to another isolation signal.

10. A signal sharing circuit, comprising:
    a first pad adapted to receive a signal;
    a part pad coupled to a first microelectronic die;
    an isolation device adapted to transfer the signal from the first pad to the part pad in response to an isolation control signal;
    an isolation control circuit to provide the isolation control signal;
    a programmable element connected to the isolation control device to permanently isolate the first microelectronic die from the part pad; and a sharing device coupled to receive the signal and to serially transfer the signal to a second microelectronic die under control of a share control circuit.

11. The signal sharing circuit of claim 10, wherein the isolation control circuit comprises:
   a probe pad to receive a control signal; and
   a programmable device adapted to selectively disconnect or connect the probe pad to the isolation device.

12. The signal sharing circuit of claim 11, wherein the programmable device is one of metal oxide semiconductor (MOS) device, a multiplexor, a conductive jumper, a ball-bond, a fuse type device or an anti-fuse type device.

13. The signal sharing circuit of claim 11, wherein the isolation circuit further comprises another device to selectively prevent the probe pad from being coupled to the part pad during a predetermined use of the microelectronic die.

14. The signal sharing circuit of claim 10, wherein the isolation control circuit comprises a circuit to provide a signal to selectively turn off the first microelectronic die.

15. A signal sharing circuit, comprising:
   a first pad adapted to receive a signal;
   a part pad coupled to a first microelectronic die;
   an isolation device adapted to transfer the signal from the first pad to the part pad in response to an isolation control signal;
   an isolation control circuit to provide the isolation control signal;
   wherein the isolation control circuit comprises a circuit to provide a signal to selectively turn off the first microelectronic die; and
   wherein the circuit to provide a signal to selectively turn off the first microelectronic die comprises:
   a first probe pad adapted to receive a first control signal;
   a first MOS device of one type including a gate coupled to the first probe pad;
   a second MOS device of another type including a gate coupled to the first probe pad and a first terminal coupled to a first terminal of the first MOS device and a second terminal connected to ground potential;
   a second probe pad adapted to receive a second control signal;
   a logic gate including one input coupled to the second probe pad and a second input coupled to the first terminal of the first MOS device and to the first terminal of the second MOS device and an output connected to the first microelectronic die to provide the signal to selectively turn power off to the first microelectronic die;
   an inverter including an input coupled to the second probe pad;
   a third MOS device of the one type including a gate connected to an output of the inverter and a first terminal connectable to a high signal and a second terminal connected to a second terminal of the first MOS device; and
   a fourth MOS device of the other type including a gate connected to the output of the inverter and a first terminal connected to the second terminals of the first and third MOS devices and a second terminal connected to ground.

16. A programmable signal sharing circuit, comprising:
   a first pad adapted to receive a signal;
   a part pad coupled to a first microelectronic die;
   a isolation circuit adapted to transfer the signal from the first pad to the part pad in response to an isolation control signal;
   a first sharing device adapted to pass the signal in one direction to a second microelectronic die on one side of the first microelectronic die in response to a first share control signal;
   a second sharing device adapted to couple the signal to a third microelectronic die on another side of the first microelectronic die in response to a second share control signal; and
   a programmable element connected to the first sharing device to permanently isolate the second microelectronic die from the first microelectronic die.

17. The programmable signal sharing circuit of claim 16, wherein the isolation circuit comprises at least one metal oxide semiconductor (MOS) device.

18. The programmable signal sharing circuit of claim 16, wherein each of the sharing devices comprise an MOS device.

19. The programmable signal sharing circuit of claim 16, wherein at least the first pad is adapted to be contacted by an external pin.

20. The programmable signal sharing circuit of claim 16, wherein at least the first pad is formed on one of a scribe area, the first microelectronic die, a mutant die or a sacrifice die.

21. A signal sharing circuit, comprising:
   a first pad adapted to receive a signal;
   a part pad coupled to a first microelectronic die;
   a isolation circuit adapted to transfer the signal from the first pad to the part pad in response to an isolation control signal;
   a first sharing device adapted to serially couple the signal to a second microelectronic die on one side of the first microelectronic die in response to a first share control signal;
   a second sharing device adapted to serially couple the signal to a third microelectronic die on another side of the first microelectronic die in response to a second share control signal;
   a first share control circuit to provide the first share control signal;
   a second share control circuit to provide the second share control signal;
   an isolation control circuit to provide the isolation control signal; and
   a programmable element connected to the first and second sharing devices to permanently isolate the second or third microelectronic dies from the first microelectronic die.

22. The signal sharing circuit of claim 21, wherein the first and second share control circuits each comprise a receiving device to receive a control signal.

23. The signal sharing circuit of claim 22, wherein the receiving device comprises at least one of a probe pad, a radio frequency identification control (RFID) or a fuse type control.

24. The signal sharing circuit of claim 21, wherein the isolation circuit comprises:
   a probe pad adapted to receive an isolation control signal; and
   a programmable device to selectively disconnect or connect the probe pad to the isolation circuit.

25. The signal sharing circuit of claim 24, wherein the programmable device is one of an MOS device, a multiplexor, a conductive jumper, a ball-bond, a fuse type device and an anti-fuse type device.

26. A signal sharing circuit, comprising:
   at least one pad adapted to receive a signal;

a plurality of sharing devices, wherein at least one sharing device is associated with each one of a plurality of microelectronic dies to share the signal with an adjacent die in response to the at least one sharing device receiving a share control signal; and
a programmable element connected to the at least one sharing device to permanently isolate one of the plurality of microelectronic dies from the share control signal.

27. The signal sharing circuit of claim 26, further comprising:
a part pad coupled to each microelectronic die; and
an isolation circuit associated with each microelectronic die and adapted to apply the signal to the part pad of each microelectronic die in response to an associated isolation control signal.

28. The signal sharing circuit of claim 26, wherein a pair of sharing devices of the plurality of sharing devices is associated with each microelectronic die to selectively share the signal with dies on either side of each microelectronic die.

29. The signal sharing circuit of claim 26, wherein the microelectronic die is one of a memory chip or a processor chip and the signal is one of an address test signal, a command test signal or a data signal to test the memory chip or processor chip.

30. A microelectronic die, comprising:
a first pad on a first microelectronic die adapted to receive a signal;
a sharing device on a first microelectronic die adapted to share the signal with at least a second microelectronic die in response to a share control signal; and
a programmable element connected to the at least one sharing device to electrically isolate the signal on the first microelectronic die from the at least the second microelectronic die.

31. The microelectronic die of claim 30, further comprising:
a part pad coupled to the microelectronic die; and
an isolation circuit adapted to apply the signal to the part pad in response to an isolation control signal.

32. The microelectronic die of claim 30, wherein the at least one sharing device is an MOS device.

33. A microelectronic die, comprising:
a first pad adapted to receive a signal;
a sharing device adapted to share the signal with at least a second microelectronic die in response to a share control signal;
a programmable element connected to the at least one sharing device to electrically isolate the at least the second microelectronic die from the signal; and
another sharing device to share the signal with at least a third microelectronic die.

34. A microelectronic die, comprising:
a multiplicity of probe pads each adapted to receive an associated test signal;
a plurality of first sharing devices each coupled to a selected one of the multiplicity of probe pads to selectively share the associated test signal with at least a second microelectronic die in one direction relative to the microelectronic die in response to each first sharing device receiving an associated share control signal; and
a programmable element connected to the at least one sharing device to permanently isolate the at least the second microelectronic die from the test signal.

35. The microelectronic die of claim 34, further comprising a plurality of second sharing devices each coupled to an associated one of the plurality of first sharing devices to selectively share the associated test signal in another direction relative to the microelectronic die in response to each second sharing device receiving another associated share control signal.

36. The microelectronic die of claim 34, further comprising an isolation circuit adapted to apply the signal to the microelectronic die in response to an isolation control signal.

37. A semiconductor wafer, comprising:
a plurality of microelectronic dies;
a first pad adapted to receive a signal;
at least one sharing device associated with each of the plurality of microelectronic dies adapted to share the signal in one direction from each of the plurality of microelectronic dies in response to a share control signal; and
a programmable element connected to the at least one sharing device to programmabley isolate one of the plurality of microelectronic dies from the signal.

38. The semiconductor wafer of claim 37, further comprising a second sharing device associated with each microelectronic die adapted to share the signal in another direction from each of the plurality of microelectronic dies in response to a second share control signal.

39. The semiconductor wafer of claim 38, further comprising a conductive line formed in a redistribution layer to connect the at least one sharing device associated with each microelectronic die to the second sharing device associated with an adjacent microelectronic die.

40. The semiconductor wafer of claim 37, further comprising:
a part pad coupled to each of the plurality of microelectronic dies; and
an isolation device associated with each of the plurality of microelectronic dies and adapted to apply the signal to the part pad in response to an associated isolation control signal.

41. The semiconductor wafer of claim 37, wherein the first pad is formed on one of a scribe, one of the plurality of microelectronic dies, a mutant die or a sacrifice die.

42. A semiconductor wafer, comprising:
a plurality of microelectronic dies divided into groups of a chosen number of dies;
a set of test pads associated with each group of microelectronic dies, each test pad being adapted to receive a predetermined signal;
at least one sharing device associated with each of selected ones of the plurality of test pads and associated with each microelectronic die to selectively share the predetermined signal with other microelectronic dies in response to a first share control signal; and
a programmable element connected to the at least one sharing device to permanently isolate the each microelectronic dies from the selected ones of the plurality of test pads.

43. The semiconductor wafer of claim 42, further comprising a second sharing device associated with each of the selected ones of the plurality of test pads and associated with each microelectronic die to selectively share the predetermined signal with other microelectronic dies in response to a second share control signal, wherein the at least one sharing device shares the predetermined signal in one direction and the second sharing device shares the predetermined signal in another direction.

44. The semiconductor wafer of claim 43, further comprising:
- a first share control circuit associated with each at least one sharing device to provide the first share control signal; and
- a second share control circuit associated with each second sharing device to provide the second share control signal.

45. The semiconductor wafer of claim 44, wherein each of the first and second share control circuits comprise:
- a probe pad adapted to receive a share control signal; and
- a programmable device to selectively connect or disconnect the probe pad from an associated one of the first and second share devices.

46. The semiconductor wafer of claim 45, wherein each of the first and second share control circuits further comprise another device to selectively prevent the probe pad from being coupled to the microelectronic die during a predetermined use of the microelectronic die.

47. The semiconductor wafer of claim 42, further comprising:
- a part pad coupled to each microelectronic die;
- an isolation device associated with each microelectronic die and adapted to apply the predetermined signal to the part pad in response to an isolation control signal; and
- an isolation control circuit associated with each isolation device to provide the isolation control signal.

48. The semiconductor wafer of claim 47, wherein each isolation control circuit comprises:
- a probe pad to receive a control signal; and
- a programmable device adapted to selectively disconnect or connect the probe pad to the isolation device.

49. The semiconductor wafer of claim 48, wherein each isolation circuit further comprises another device to selectively prevent the probe pad from being coupled to the part pad during a predetermined use of the microelectronic die.

50. The semiconductor wafer of claim 42, wherein the test pads are formed on one of a scribe, one of the microelectronic dies in each group, a mutant die or a sacrifice die.

51. A method of making a signal sharing circuit, comprising:
- forming a first pad adapted to receive a signal;
- forming a first share device associated with a first microelectronic die adapted to serially share the signal with at least a second microelectronic die on one side of the first microelectronic die; and
- forming a programmable element connected to the first share device to electrically isolate the second microelectronic die from the signal.

52. The method of claim 51, further comprising forming a second sharing device to share the signal with at least a third microelectronic die on another side of the first microelectronic die.

53. The method of claim 51, further comprising:
- forming a part pad coupled to each microelectronic die; and
- forming an isolation device associated with each microelectronic die.

54. A method of making a signal sharing circuit, comprising:
- forming a first pad adapted to receive a signal;
- forming a first share device associated with a first microelectronic die adapted to pass the signal to at least a second microelectronic die on one side of the first microelectronic die in response to a first share control signal;
- forming a first share control circuit to provide a first share control signal; and
- forming a programmable element connected to permanently isolate the at least second microelectronic die from the signal.

55. A method of making a signal sharing circuit, comprising:
- forming a first pad adapted to receive a signal;
- forming a first share device associated with a first microelectronic die adapted to share the signal with at least a second microelectronic die on one side of the first microelectronic die in response to a first share control signal;
- forming a first share control circuit to provide a first share control signal;
- forming a programmable element connected to permanently isolate the at least second microelectronic die from the signal;
- forming a second share device associated with the first microelectronic die adapted to share the signal with at least a third microelectronic die on another side of the first microelectronic die in response to a second share control signal; and
- forming a second share control circuit to provide a second share control signal.

56. A method of making a microelectronic die, comprising:
- forming a first pad on a first microelectronic die adapted to receive a signal;
- forming a sharing device adapted to pass the signal to at least a second microelectronic die; and
- forming a programmable element connected to permanently isolate the signal on the first microelectronic die from the at least the second microelectronic die.

57. The method of claim 56, further comprising forming another sharing device to share the signal with at least a third microelectronic die.

58. The method of claim 56, wherein forming each sharing device comprises forming an MOS device.

59. A method of making a microelectronic die, comprising:
- forming a multiplicity of probe pads each adapted to receive an associated signal;
- forming a plurality of first sharing devices each coupled to a selected one of the multiplicity of probe pads to selectively share the associated signal with at least a second microelectronic die in one direction from the microelectronic die in response to receiving an associated share control signal; and
- forming a programmable element connected to permanently isolate the at least second microelectronic die from the associated signal.

60. The method of claim 59, further comprising forming a plurality of second sharing device, each associated with one of the plurality of first sharing devices to selectively share the associated test signal with at least a third microelectronic die in another direction from the microelectronic die in response to receiving another associated share control signal.

61. A method of making a semiconductor wafer, comprising:
- forming a plurality of microelectronic dies;
- forming a first pad adapted to receive a signal; and forming at least one sharing device associated with each of the plurality of microelectronic dies adapted to share the signal in one direction from each of the plurality of microelectronic dies in response to a share control signal; and forming a programmable element connected to permanently isolate one of the plurality of microelectronic dies from the signal.

62. The method of claim 61, further comprising forming a second sharing device associated with each microelectronic die adapted to share the signal in another direction from each of the plurality of microelectronic dies in response to a second share control signal.

63. A method of sharing a test signal across a semiconductor wafer, comprising:

applying the test signal to a test pad;

operating a share device to share the test signal in one direction relative to a first microelectronic die by passing the test signal from the first microelectronic die to a second electronic die; and programming an element to isolate the microelectronic die from the test signal so that the test signal is not passed to the second microelectronic die.

64. The method of claim 63, further comprising operating another share device to share the test signal in another direction relative to the first microelectronic die.

65. The method of claim 64, wherein operating each of the share devices comprises sending a gate signal to operate a MOS transistor.

66. The method of claim 63, further comprising operating an isolation device to apply the test signal to the first microelectronic die.

67. The method of claim 66, further comprising preventing the isolation device and the sharing device from operating during a predetermined use of the first microelectronic die.

68. A method of sharing a test signal across a semiconductor wafer, comprising:

applying the test signal to a test pad on a first microelectronic die;

selectively sharing the test signal in at least one direction with a plurality of other microelectronic dies; and programming an element to isolate one of the plurality of other microelectronic die from the test signal on the first microelectronic die.

69. The method of claim 68, wherein selectively sharing the test signal comprises operating at least one sharing device associated with the each of the other microelectronic die to share the test signal in one direction.

70. A method of sharing a test signal across a semiconductor wafer, comprising:

applying the test signal to a test pad;

selectively sharing the test signal in at least one direction with a plurality of microelectronic dies; programming an element to isolate one of the plurality of microelectronic die from the test signal;

wherein selectively sharing the test signal comprises operating at least one sharing device associated with each microelectronic die to share the test signal in one direction; and operating a second sharing device associated with each microelectronic die to share the test signal in another direction.

* * * * *